United States Patent
Andoh

(10) Patent No.: US 6,579,772 B2
(45) Date of Patent: Jun. 17, 2003

(54) DISCRETE SEMICONDUCTOR DEVICE AND MANUFACTURING METHOD THEREOF

(75) Inventor: Hideyuki Andoh, Saitama-ken (JP)

(73) Assignee: Sanken Electric Co., Ltd., Saitama-ken (JP)

(*) Notice: Subject to any disclaimer, the term of this patent is extended or adjusted under 35 U.S.C. 154(b) by 0 days.

(21) Appl. No.: 10/013,210

(22) Filed: Dec. 7, 2001

(65) Prior Publication Data

US 2002/0072207 A1 Jun. 13, 2002

(30) Foreign Application Priority Data

Dec. 12, 2000 (JP) ........................................ 2000-377483

(51) Int. Cl.[7] ........................................... H01L 21/8222
(52) U.S. Cl. ........................................ 438/328; 257/551
(58) Field of Search ............................ 438/328, 983, 438/912; 257/551

(56) References Cited

U.S. PATENT DOCUMENTS 4,789,887 A * 12/1988 Crossley et al. ............ 357/55
5,357,126 A * 10/1994 Jimenez ...................... 257/173
5,756,387 A * 5/1998 Villa et al. .................. 438/328

* cited by examiner

*Primary Examiner*—Hoai Ho
*Assistant Examiner*—Quoc Hoang
(74) *Attorney, Agent, or Firm*—Kilpatrick Stockton LLP

(57) ABSTRACT

A semiconductor device is provided, which prevents the development of localized breakdowns at the semiconductor sidewall, having a stabilized, desired breakdown voltage. It embraces a p-type third semiconductor region formed on a first main surface of an n-type semiconductor body; an n-type second semiconductor region selectively formed at the center of a second main surface; an n-type first semiconductor region formed between the third and the second semiconductor regions; and, n-type fourth semiconductor region surrounding the first and the second semiconductor regions. The impurity concentration of the first semiconductor region is set higher than that of the fourth semiconductor region.

12 Claims, 8 Drawing Sheets

DISCRETE SEMICONDUCTOR DEVICE AND MANUFACTURING METHOD THEREOF

BACKGROUND OF THE INVENTION

1. Field of the Invention

The present invention relates to a semiconductor device, which may be used as, for example, a semiconductor rectifying element having low reverse breakdown voltage such as a voltage regulator diode (Zener diode), and a manufacturing method thereof.

2. Description of the Related Art

A semiconductor diode 1 such as the voltage regulator diode shown in FIG. 1 is known. This semiconductor diode 1 may have, for example, a simple three-layer structure embracing an n-type semiconductor region 2 having a high impurity concentration, an n-type semiconductor region 3 having predetermined specific impurity concentration, and a p-type semiconductor region 4 having a high impurity concentration. In addition, on the top surface of n-type semiconductor region 2 and the bottom surface of p-type semiconductor region 4, there may be formed metal films 5, 6, which serve as the respective electrodes thereof.

Typically, with a semiconductor diode having such a stacked structure, there exists a strong electric field in the depletion layer of a p-n junction to which a reverse bias voltage is applied; however, at the chip sidewall, whereat the terminal portion of the p-n junction is exposed, it may be influenced by the impurities, ions, or the like adhered to the surface, and the electric field may become even stronger in places making it easier for breakdowns to occur. As a result, with the semiconductor diode, it becomes difficult to obtain a reverse breakdown voltage that is theoretically expected. Therefore, in order to reduce the electric field at the chip sidewall 7 of the semiconductor diode 1 as shown in FIG. 1, the chip sidewall 7 exposing the terminal portions of the p-n junction is cut so as to form the necessary angle with the p-n junction interface 9 employing a beveled structure, which is made to reduce the electric field. By employing such beveled structure, the electric field at the chip sidewall 7 may be decreased and breakdowns made to occur throughout the entirety of the junction interface, resulting in stabilization of the device performance, achieving the constant breakdown voltage. It may be noted that, as is well known, by employing a beveled structure in a power semiconductor device having higher breakdown voltage than the voltage regulator diode, the breakdown voltage can be improved.

Nevertheless, as described in the following, there are problems with the semiconductor diode 1 shown in FIG. 1.

(1) With the semiconductor diode 1 shown in FIG. 1, during the assembling process, after the chip sidewall 7 is subjected to a wet cleansing process using an acidic or alkaline chemical to protect them from the external environment, the chip sidewall 7 is covered with an insulating layer 8. However, product evaluation testing results for the semiconductor diode 1 manufactured in this manner indicated points where the performances and quality of the product were not stabilized. The changes in the surface state and surface damage to the chip sidewall 7 imparted by the wet cleansing and the covering thereof by the insulating layer 8 were given as the reasons for the poor performances, and so on, not being stabilized. Since the surface state of an actual semiconductor chip is extremely active, it is extremely difficult to control the precision and reproducibility of such surface state.

(2) In the semiconductor diode 1 shown in FIG. 1, the breakdown voltage is determined by the impurity concentration in the n-type semiconductor region 3 at the p-n junction between the n-type semiconductor region 3 and the p-type semiconductor region 4. However, in order to determine this breakdown voltage, the resistivity $\rho$ of the semiconductor wafer (silicon wafer) used in manufacturing process needs to be controlled with great precision. As a result, it becomes necessary to specially order a custom-made semiconductor wafer having a strictly defined resistivity $\rho$ from a semiconductor wafer manufacturer, and carefully test it after delivery as well. Therefore, a problem lies in the semiconductor wafer being costly. As an example, silicon wafers having a resistivity within the narrow range of 0.01 to 0.03 $\Omega \cdot cm$—which corresponds to the impurity concentration range of approximately $5 \times 10^{18}/cm^3$ to $7 \times 10^{17}/cm^3$ with the n-type silicon—have been conventionally custom-ordered.

(3) When manufacturing the semiconductor diode 1 shown in FIG. 1, in order to have a beveled structure by forming the chip sidewall 7 at a slant angle relative to the p-n junction plane, a problem lies in the manufacturing processes increasing in number due to the addition of various processes such as sandblasting, grinding, polishing or etching.

(4) In the assembling process of the semiconductor diode 1 shown in FIG. 1, chips cut from a semiconductor wafer are scheduled to be packaged. However, since the chip sidewalls of the respective chips are at the slant angle relative to the top/bottom surfaces of the chips, it requires much effort to load the respective chips onto jigs, such as the collets.

The present invention has come about in order to solve the above problems. Therefore, an object of the present invention is to provide a semiconductor device preventing the development of localized breakdown at the chip sidewall exposing a p-n junction, obtaining a stabilized, desired breakdown voltage.

Another object of the present invention, is to provide a semiconductor device and manufacturing method thereof, which allows for a reduction in cost of the semiconductor wafer and allows for the range of allowable resistivity $\rho$ of the semiconductor wafer used to be widened.

Still another object of the present invention is to provide a semiconductor device manufacturing method, which allows chip surface passivation processing to be simplified or to be abbreviated.

Still another object of the present invention is to provide a semiconductor device and a manufacturing method thereof, which allows the manufacturing process to be simplified.

Yet still another object of the present invention is to provide a semiconductor device allowing for favorable handling and favorable loading of the chip into a jig, such as the collet, during the product assembly process.

SUMMARY OF THE INVENTION

In order to solve the aforementioned problems, a first aspect of the present invention inheres in a semiconductor device encompassing (a) a first semiconductor region of a first conductivity-type including a first end surface, a second end surface opposite the first end surface and a first outer surface connecting the first and second end surfaces; (b) a second semiconductor region of the first conductivity-type having a third end surface, a fourth end surface opposite the third end surface and a second outer surface connecting the third and fourth end surfaces, wherein the fourth end surface is in contact with the first end surface; (c) a third semiconductor region of a second conductivity-type, which is in contact with the first semiconductor region at the second end surface; and (d) fourth semiconductor region having an inner surface in contact with the first and second outer surfaces and an impurity concentration lower than the first semiconductor region, which is in contact with the third semiconductor region. Here the second conductivity type is the opposite conductivity type as the first conductivity type. More specifically, if the first conductivity type is assigned to be n-type, then the second conductivity type is p-type; and if the first conductivity type is assigned to be p-type, then the second conductivity type is n-type. The first conductivity type or the second conductivity type may further be an intrinsic semiconductor. For example, two p-n junction interfaces may be implemented by bringing both a high impurity concentration n-type first semiconductor region and relatively low impurity concentration n-type fourth semiconductor region into contact with a p-type third semiconductor region. Alternatively, a high impurity concentration p-type first semiconductor region and a relatively low impurity concentration p-type fourth semiconductor region may be brought into contact with an n-type third semiconductor region to provide two p-n junction interfaces is also allowable. In the case where the fourth semiconductor region is the second conductivity type, the p-n junction interface forms the boundary of the second semiconductor region and the fourth semiconductor region. In addition, the first and second outer surfaces may each respectively be a curved surface including one, two, or more certain radii of curvature.

The semiconductor device according to the first aspect of the present invention makes it easier for a breakdown to occur in the p-n junction between the first semiconductor region and the third semiconductor region than in the p-n junction between the fourth semiconductor region and the third semiconductor region positioned at the outer edge side of the semiconductor device (semiconductor chip). As a result, the electric field at the sidewall (chip sidewall) of the semiconductor device is reduced, and a breakdown is made to occur in the junction interface within the semiconductor device to allow stabilization in the prescription of the breakdown voltage. This manner of measured stabilization in the breakdown voltage is, for example, more effective in a power semiconductor device having a higher breakdown voltage than in a voltage regulator diode.

In the semiconductor device according to the first aspect of the present invention, it is preferable for the fourth semiconductor region to be a semiconductor substrate cut from bulk crystal. By adjusting the impurity concentration of the first semiconductor region, the electrical characteristics of the semiconductor device can be controlled making it so that the impurity concentration of the fourth semiconductor region does not influence the electrical characteristics of the semiconductor device. As a result, it is possible to use the fourth semiconductor region with the doping specifications of the wafer (semiconductor substrate) as it is when it is cut from the bulk crystal at the time of purchase. Namely, there is no longer any need to strictly set the doping specifications of the semiconductor substrate and it is possible to widen the range from which the semiconductor substrate (wafer) to be used may be chosen.

In the semiconductor device according to the first aspect of the present invention, the outer surfaces of the fourth semiconductor region serves as the chip outer-surface of the semiconductor device, and it is preferable that the chip outer-surface be substantially orthogonal with the second end surface of the first semiconductor region. In the case where the fourth semiconductor region has a first conductivity type, the outside p-n junction interface is exposed at the chip outer surface. However, since the breakdown at the p-n junction occurs earlier in the central portion than at the edge portion, even if there are some changes in the surface state or surface damage occurs in the outer surfaces of the semiconductor device, it is possible to suppress variations in the breakdown voltage of the semiconductor device occur. In particular, the breakdown of the p-n junction exposed at the edge portion of the chip (the chip outer surface) is dependent on the passivation architecture of the chip outer surface and "variations" in the breakdown voltage at the edge portion of the earlier chip was large. However, with the semiconductor device according to the first aspect of the present invention, since the breakdown occurs earlier in the central portion than the chip outer surface, even if there are some changes in the surface state or surface damage occurring at the edge portion of the semiconductor device (chip), it is possible to suppress fluctuations in the breakdown voltage of the semiconductor device. Accordingly, variations in the product performance are reduced, and manufacturing process yield is improved.

In the case where the fourth semiconductor region has the second conductivity type, the outside p-n junction interface is formed at the boundary of the second semiconductor region and the fourth semiconductor region, and the outside p-n junction interface is not exposed at the chip outer surface. More specifically, in this case, since the outside p-n junction interface is formed on the top surface-side of the chip, it does not come under the influence of changes in the surface conditions of the chip outer surface or surface damage. In particular, since the p-n junction is not exposed at the edge portion (chip outer surface) of the chip, there is no detailed and complicated passivation architecture required for the chip outer surface.

Moreover, since the chip outer-surface is made substantially orthogonal with the first end surface of the first semiconductor region, it is possible to form sidewall of the semiconductor device with a typical cutting process (dicing process). "Substantially orthogonal" means within the range of variations of angle developing during a typical cutting process (dicing process), and intentionally means that beveling is not performed. For example, if an 80° to 100° angle is formed, this can be seen as being substantially orthogonal (=90°). It is preferable that an 87° to 93° angle be formed. If the chip outer-surface is substantially orthogonal with the edge surfaces, the handling of the semiconductor device (chip) during a fabrication (assembly) process using a jig, such as the collet, is improved.

In the first aspect of the present invention, it is preferable that a first main electrode layer be formed at the bottom surface of the third semiconductor region, and a second main electrode layer be formed at the top surface of the second semiconductor region. With the first main electrode layer and the second main electrode layer, the operational region (the main body portion), which is the main current path of the semiconductor element, is identified. "The first main electrode layer" may mean either an anode electrode layer or a cathode electrode layer in the semiconductor diode or a thyristor. The thyristor is capable of including a gate turn-off (GTO) thyristor or a static induction thyristor (SI thyristor). If the third semiconductor region is n-type, then the first main electrode layer is a cathode electrode layer. "The second main electrode layer" may mean either a cathode electrode layer or anode electrode layer in the semiconductor diode or thyristor, but not the above-mentioned first main electrode layer. If the second semiconductor region is assigned to be p-type, then the second main electrode layer is an anode electrode layer. As a result, the third semiconductor region serves as a "first main electrode region" contacted to the first main electrode layer, and the second semiconductor region serves as a "second main electrode region" contacted to the second main electrode layer.

Moreover, the "first main electrode layer" may be either an emitter electrode layer or a collector electrode layer in a bipolar transistor (BJT) or an insulated-gate bipolar transistor (IGBT). A BJT may include an high frequency transistor such as a hetero-junction bipolar transistor (HBT), which operates in the microwave band, the millimeter-wave band or sub-millimeter-wave band. Moreover, the present invention may be applicable to an insulated-gate field effect transistor (IGFET) such as a metal-oxide-semiconductor field effect transistor (MOSFET), metal-oxide-semiconductor static induction transistor (MOSSIT), or high electron mobility transistor (HEMT). In this IGFET, the "first main electrode layer", means either a source electrode layer or a drain electrode layer. In addition, in a BJT or an IGBT, the "second main electrode layer" may mean either an emitter electrode layer or a collector electrode layer, but not the above-mentioned first main electrode layer; and in an IGFET, it may either mean a source electrode layer or drain electrode layer, but not the above-mentioned first main electrode layer. It is noted that in a BJT, an IGBT, an IGFET, or the like, it is also, of course, allowable to further add a control electrode layer for the base electrode layer, the gate electrode layer, or the like.

A second aspect of the present invention inheres in a method of manufacturing a semiconductor device encompassing, (a) forming a first semiconductor region by selectively doping first conductivity-type impurity elements through a first main surface of a semiconductor substrate to a predetermined diffusion depth; (b) forming a second semiconductor region, which is in contact with the first semiconductor region, by selectively doping the first conductivity-type impurity elements through second main surface of the semiconductor substrate to a predetermined diffusion depth; and (c) forming a third semiconductor region by doping second conductivity-type impurity elements having a conductivity type opposite that of the first conductivity type through the entire first main surface of the semiconductor substrate, and forming a p-n junction with the first semiconductor region. Here it is allowable for either the step of forming the first semiconductor region or the step of forming the second semiconductor region to be performed first. In addition, it is allowable for a diffusion window for selective diffusion to be opened in the first and second main surfaces, and diffusion be performed through both main surfaces simultaneously. Moreover, pre-deposition or an ion implantation process is performed first in the time sequence on either the first or second main surface side of the semiconductor substrate; however, the driving-in (annealing processing) process may be performed simultaneously, and the first and second semiconductor regions formed substantially simultaneously. The semiconductor substrate surrounding the first semiconductor region and the second semiconductor region and remaining as the base material corresponds to the fourth semiconductor region mentioned in the first aspect. As long as the impurity concentration is lower than the first or second semiconductor region, the semiconductor substrate may be either the first conductivity type, the second conductivity type, or even, an intrinsic semiconductor.

According to the method of manufacturing a semiconductor device according to the second aspect of the present invention, a first semiconductor region can be formed within the semiconductor substrate by selectively doping the first conductivity-type impurity elements through a first main surface of the semiconductor substrate. This first semiconductor region is formed with a higher impurity concentration than the fourth semiconductor region surrounding this first semiconductor region and second semiconductor region.

In the case where the semiconductor substrate is the first conductivity type, for example, two p-n junction interfaces may be implemented by bringing the high impurity concentration n-type first semiconductor region and the relatively low impurity concentration n-type semiconductor substrate (fourth semiconductor region) into contact with the p-type third semiconductor region. Therefore, after forming the first semiconductor region, it is possible for a breakdown to occur earlier in the p-n junction of the third semiconductor region, which is formed by doping the second conductivity-type impurity elements through the entire surface of the first main surface of the semiconductor substrate, and the first semiconductor region, than the p-n junction between the fourth semiconductor region and the third semiconductor region. As a result, the electric field at the sidewall (chip sidewall) of the semiconductor device is reduced, and a breakdown is made to occur in the junction interface within the semiconductor device allowing for stabilization of the device performance ascribable to the constant breakdown voltage.

In the case where the semiconductor substrate is the second conductivity type, the outside p-n junction interface is formed at the boundary of the second semiconductor region and the semiconductor substrate (fourth semiconductor region), and the outside p-n junction interface is not exposed to the outer surfaces of the semiconductor substrate (chip). Namely, in this case, the outside p-n junction interface is formed at the second main surface of the semiconductor substrate. More specifically, in this case, since the outside p-n junction interface is formed at the second main surface of the semiconductor substrate, there is no influence on it by changes in the surface state of the chip outer surface or surface damage. In particular, since the p-n junction is not exposed at the chip edge portion (chip outer surface), there is no detailed and complicated passivation architecture required for the chip outer surface. Moreover, it is possible to make it so that breakdown occurs earlier at the p-n junction at the boundary of the first semiconductor region and the third semiconductor region, than at the p-n junction exposed at the second main surface of the semiconductor substrate. As a result, the electric field of the second main surface side of the semiconductor substrate is reduced, and it is possible to make a breakdown occur at the junction interface within the semiconductor device, allowing stable device operation with a stabilized breakdown voltage.

In addition, by adjusting the impurity concentration of the first semiconductor region, it is possible to determine the electrical characteristics of the semiconductor device, and it is possible for the impurity concentration of the fourth semiconductor region to not have influence on the electrical characteristics of the semiconductor device. As a result, the semiconductor substrate can be utilized with the impurity concentration of the purchased specifications without requiring rigid setting of the impurity concentration. Therefore, it is possible to widen the range, from which the semiconductor substrate to be selected.

In addition, in the method of manufacturing a semiconductor device according to the second aspect of the present invention, by allowing for simultaneous performing of the thermal diffusion (driving-in) process of the first conductivity-type impurity elements for forming the second semiconductor region, and the thermal diffusion (driving-in) process of the second conductivity-type impurity elements for forming the third semiconductor region, the efficiency with which the semiconductor device is manufactured may be improved.

In the method of manufacturing a semiconductor device according to the second aspect of the present invention, it is preferable that there further include a process of dicing a plurality of semiconductor chips by cutting the semiconductor substrate along a plane substantially orthogonal with the p-n junction interface formed between the third semiconductor region and the first semiconductor region, and obtaining a plurality of semiconductor devices from the respective plurality of semiconductor chips. In this case, by adhering either one of the main surface sides of the semiconductor substrate to a synthetic resin sheet and then cutting the chips without cutting the adhered synthetic resin sheet, it is possible to store and transport each chip while still being adhered to the synthetic resin sheet. As a result, during product assembly, it becomes easier to handle the semiconductor device adhered to the synthetic resin sheet, for example, when loading into a jig such as the collet.

The third aspect of the present invention is a method of manufacturing a semiconductor device encompassing, (a) forming a first semiconductor region by selectively doping first conductivity-type impurity elements through a first main surface of a semiconductor substrate to a predetermined diffusion depth; (b) forming a second semiconductor region, which is in contact with the first semiconductor region, by selectively doping the first conductivity-type impurity elements through second main surface of the semiconductor substrate to a predetermined diffusion depth; and (c) forming a third semiconductor region by doping second conductivity-type impurity elements having a conductivity type opposite that of the first conductivity type through the entirety of the second main surface of the semiconductor substrate, and forming a p-n junction with the second semiconductor region. More specifically, the main surface on which the third semiconductor region is formed is the reverse of that of the method of manufacturing a semiconductor device according to the second aspect of the present invention. However, it makes no difference whether the step forming the first semiconductor region or the step forming the second semiconductor region is performed first. In addition, it is allowable for a diffusion window for selective diffusion to be opened in the first and second main surfaces of the semiconductor substrate, and diffusion be performed through both main surfaces simultaneously. Moreover, pre-deposition or an ion implantation process is performed first in the time sequence on either the first or second main surface side of the semiconductor substrate; however, the driving-in (annealing processing) process may be performed simultaneously, and the first and second semiconductor regions formed substantially simultaneously. Accordingly, the only problem left is which side to define as the "first main surface" and the "second main surface", which is substantially the same for the second aspect and the third aspect of the present invention. The semiconductor substrate surrounding the first semiconductor region and the second semiconductor region, and remaining as the base material corresponds to the fourth semiconductor region mentioned in the first aspect. As long as the impurity concentration is lower than the first or second semiconductor region, then the semiconductor substrate may be either the first conductivity type, the second conductivity type, or even, an intrinsic semiconductor.

The method of manufacturing a semiconductor device according to the third aspect of the present invention, as with the method of manufacturing a semiconductor device according to the second aspect, can form the second semiconductor region within the semiconductor substrate by selectively doping the first conductivity-type impurity elements through the second main surface of the semiconductor substrate. This second semiconductor region is formed with a higher impurity concentration than the fourth semiconductor region surrounding the first semiconductor region and the second semiconductor region.

When the semiconductor substrate is the first conductivity type, after forming the second semiconductor region, it is possible to have a breakdown occur at the p-n junction between the third semiconductor region and the second semiconductor region formed by doping the second conductivity-type impurity elements through the entire surface of the second main surface of the semiconductor substrate earlier than at the p-n junction between the fourth semiconductor region and the third semiconductor region. As a result, the electric field at the sidewall (chip sidewall) of the semiconductor substrate is reduced, and it is possible to make it so that a breakdown occurs at the junction interface within the semiconductor device, allowing stable device operation with a stabilized breakdown voltage.

When the semiconductor substrate is the second conductivity type, the outside p-n junction interface is formed at the boundary between the second semiconductor region and the semiconductor substrate (the fourth semiconductor region), and the outside p-n junction interface is not exposed at the outer surfaces of the semiconductor substrate (chip). More specifically, in this case, the outside p-n junction interface is formed at the second main surface of the semiconductor substrate. Namely, in this case, since the outside p-n junction interface is formed at the first main surface side of the semiconductor substrate, there is no influence on it from changes in the surface state of the chip outer surface or surface damage. In particular, since the p-n junction is not exposed at the edge portion (chip outer surface) of the chip, there is no detailed and complicated passivation architecture required for the chip outer surface. Moreover, a breakdown is allowed to occur in the p-n junction at the boundary of the first semiconductor region and the third semiconductor region, earlier than the p-n junction exposed at the first main surface side of the semiconductor substrate. As a result, the electric field at the second main surface side of the semiconductor substrate is reduced, and a breakdown is made to occur at the junction interface within the semiconductor device, allowing stable device operation with a stabilized breakdown voltage.

In addition, by adjusting the impurity concentration of the second semiconductor region, it is possible to determine the electrical characteristics of the semiconductor device, and remove the influence of the impurity concentration of the fourth semiconductor region on the electrical characteristics of the semiconductor device. As a result, the semiconductor substrate can be utilized with the impurity concentration of the purchased specifications without requiring rigid setting of the impurity concentration. In other words, it is possible to widen the range from which the semiconductor substrate may be selected.

In the method of manufacturing a semiconductor device according to the third aspect of the present invention, as with the method of manufacturing the semiconductor device according to the second aspect, it is preferable that there further include a process of dicing a plurality of semiconductor chips by cutting the semiconductor substrate along a plane substantially orthogonal with the p-n junction interface formed between the third semiconductor region and the first semiconductor region, and obtaining a plurality of semiconductor devices from the respective plurality of semiconductor chips. In this case, by adhering either one of the main surface sides of the semiconductor substrate to a synthetic resin sheet and then cutting the chips without cutting the adhered synthetic resin sheet, it is possible to store and transport each chip while being adhered to the synthetic resin sheet. As a result, during product assembly, it becomes easier to handle the semiconductor device adhered to the synthetic sheet, for example, when loading into a jig such as the collet.

DETAILED DESCRIPTION OF THE EMBODIMENTS

Figure 1:
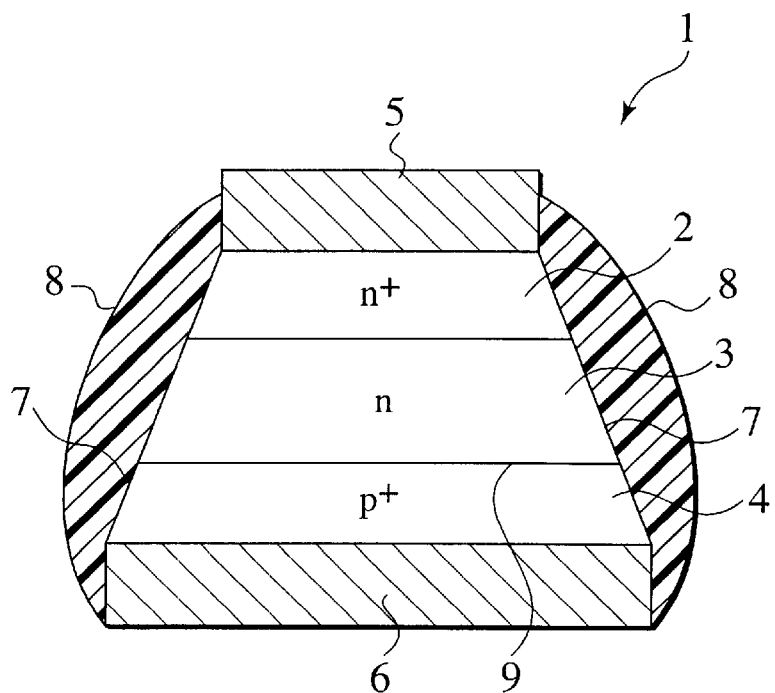
FIG. 1 is a cross-sectional view showing a conventional semiconductor device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Prepositions, such as "on", and "under" are defined with respect to a planar surface of the substrate, regardless of the orientation the substrate is actually held. A layer is on another layer even if there are intervening layers. It being understood the indicator "+" in the Figures indicates relatively strong doping and the indicator "−" in the Figures indicates relatively weak doping.

(First Embodiment)

Figure 2:
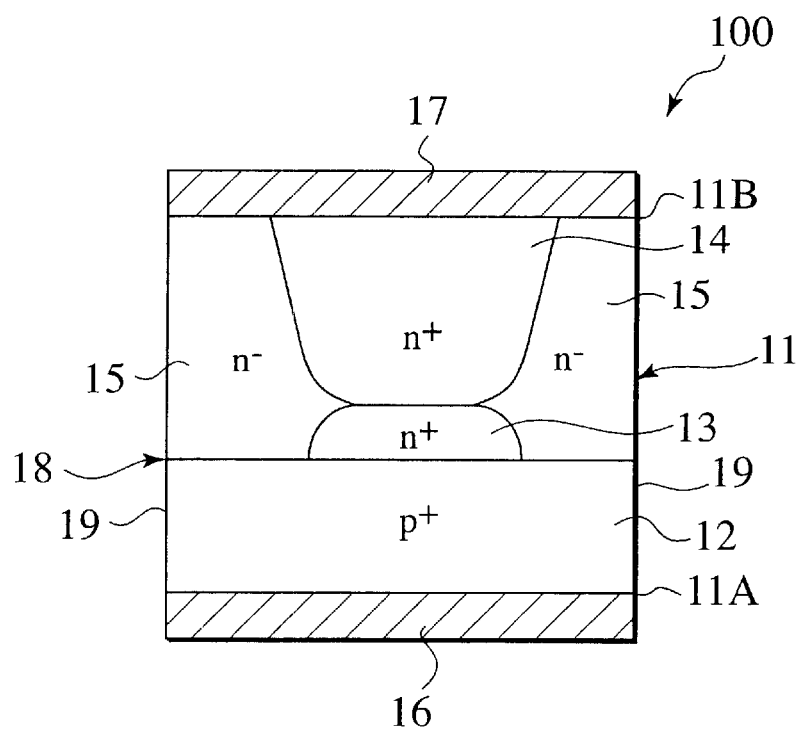
FIG. 2 is a cross-sectional view showing a semiconductor device according to the first embodiment of the present invention.

FIG. 2 is a cross-sectional view of a case where a semiconductor diode such as a voltage regulator diode is applied as a semiconductor device according to a first embodiment of the present invention. A semiconductor diode 100 according to the first embodiment of the present invention embraces a buried first semiconductor region 13 of a first conductivity-type, a second semiconductor region 14 of the first conductivity-type disposed on the first semiconductor region 13, a slab-like third semiconductor region 12 of a second conductivity-type disposed under the first semiconductor region 13, and a fourth semiconductor region 15 of the first conductivity-type. Here, the second conductivity type is the opposite conductivity type as the first conductivity type. The first semiconductor region 13 has a first end surface, a second end surface facing the first end surface and a first outer surface connecting the first and second end surfaces. The first outer surface is, as shown in FIG. 2, a curved surface having a certain radius of curvature with its top-portion convex. The second semiconductor region 14 has a third end surface, a fourth end surface facing the third end surface and a second outer surface connecting the third and fourth end surfaces; wherein the fourth end surface is in contact with the first end surface of the first semiconductor region 13. The second outer surface is, as shown in FIG. 2, a curved surface having a certain radius of curvature with its bottom portion convex. In addition, the third semiconductor region 12 is in contact with the first semiconductor region 13 at the second end surface of the first semiconductor region 13. Moreover, the fourth semiconductor region 15 has lower and upper inner surfaces in contact with the first and second outer surfaces respectively, and additionally the bottom surface of the fourth semiconductor region 15 is in contact with the top surface of the third semiconductor region 12. Accordingly, the lower and upper inner surfaces of the fourth semiconductor region 15 is combined to form a curved surface resembling a mortar shape, or a deformed hyperboloid of revolution, having two or more certain radii of curvatures.

With the semiconductor device of the first embodiment as shown in FIG. 2, the first conductivity type is assigned to be n-type, and the second conductivity type is p-type. However, needless to say, the first conductivity type may be assigned to p-type, and the second conductivity type may be n-type. As shown in FIG. 2, the fourth semiconductor region 15 has a lower impurity concentration than the first semiconductor region 13. In FIG. 2, the case is shown where the n-type first semiconductor region 13 with a high impurity concentration and the n-type fourth semiconductor region 15 with a relatively low impurity concentration are in contact with a p-type third semiconductor region 12 to implement two p-n junction interfaces on a single plane 18. Alternatively, it goes without saying that the opposite case as this, where the p-type first semiconductor region 13 with a high impurity concentration and the p-type fourth semiconductor region 15 is in contact with the n-type third semiconductor region 12 to implement two p-n junction interfaces on a single plane 18, at the top surface of the third semiconductor region 12, is also allowable.

In other words, in FIG. 2, at the first main surface 11A side of a silicon body 11 made of a first conductivity type (n-type) silicon substrate 11, the p-type third semiconductor region 12 is formed, and at the second main surface 11B side of the silicon body 11, the n-type second semiconductor region 14 is selectively formed. Within the silicon body (silicon substrate) 11, the n-type first semiconductor region 13 is buried so as to be in contact with the p-type third semiconductor region 12 at a deep place along a p-n junction interface 18. Moreover, the buried n-type first semiconductor region 13 and the n-type second semiconductor region 14 protruding from the top surface 11B are in contact in the deep place within the silicon substrate 11. In addition, the n-type fourth semiconductor region 15 is formed enclosing the n-type first semiconductor region 13 and the second semiconductor region 14.

In the first embodiment as shown in FIG. 2, on the bottom surface of the third semiconductor region 12, a first main electrode layer 16 is formed, and on the top surface of the second semiconductor region 14 a second main electrode layer 17 is formed. The second main electrode layer 17 is formed upon the entire surface of the second main surface 11B of the silicon substrate 11 so as to shunt the n-type second semiconductor region 14 and the n-type fourth semiconductor region 15. In the same manner, the first main electrode layer 16 is formed upon the entire bottom surface of the third semiconductor region 12, in other words, upon the entire surface of the first main surface 11A of the silicon substrate 11. With the first main electrode layer 16 and second main electrode layer 17 the principal operational region, which is the main current path of the semiconductor element, is identified. "First main electrode layer 16" may mean either the anode electrode layer or the cathode electrode layer in the semiconductor diode shown in FIG. 2. Since the third semiconductor region 12 is assigned to be p-type in FIG. 2, the first main electrode layer 16 is identified as the anode electrode layer. "Second main electrode layer 17" may mean either a cathode electrode layer or an anode electrode layer, whichever the above-mentioned first main electrode layer 16 in the semiconductor diode is not. In FIG. 2, since the second semiconductor region 14 is assigned to be n-type, the second main electrode layer 17 is identified as the cathode electrode layer. As a result, the third semiconductor region 12 is identified as a "first main electrode region (anode region)" contacted with the first main electrode layer 16, and the second semiconductor region 14 is identified as a "second main electrode region (cathode region)" contacted with the second main electrode layer 17.

The p-type third semiconductor region 12 is formed from the first main surface 11A side of the silicon substrate 11 by doping to a high concentration of, for example boron (B), which is used as the impurity for the second conductivity type. In addition, the first semiconductor region 13, which is in contact with the p-type third semiconductor region 12, is doped with, for example, phosphorus (P) or arsenic (As), which is used as the impurity of the first conductivity type. Moreover, the n-type second semiconductor region 14 is doped to a high impurity concentration with, for example, phosphorus (P) or arsenic (As). In addition, the n-type fourth semiconductor region 15, which is formed so as to enclose the perimeters of both the n-type first semiconductor region 13 and the second semiconductor region 14, is prescribed to have the relatively low impurity concentration inherent to the silicon substrate 11. Namely, the n-type first semiconductor region 13 and the second semiconductor region 14 are prescribed to have a high impurity concentration relative to the n-type fourth semiconductor region 15 theresurrounding.

In the semiconductor device 100 of the first embodiment, the fourth semiconductor region 15 is made of the n-type semiconductor wafer 11, which is cut from a bulk crystal grown by floating zone (FZ) method, Czochralski (CZ) method, or magnetic field applied Czochralski (MCZ) method, etc. By adjusting the impurity concentration in the first semiconductor region 13, it is possible to control the electrical behavior (breakdown voltage) of the semiconductor device 100, and it is possible to make it so that the impurity concentration of the fourth semiconductor region 15 does not influence the electrical behavior of the semiconductor device 100. As a result, it is possible to use the fourth semiconductor region 15 with the doping specifications of the wafer (semiconductor substrate) 11 as it is when it is cut from the bulk crystal at the time of purchase.

Namely, there is no longer any need to strictly set the doping specifications of the semiconductor substrate 11 and it is possible to widen the range from which the semiconductor substrate (wafer) 11 to be used may be chosen.

In the semiconductor device 100 of the first embodiment, the outer surface of the fourth semiconductor region 15 defines the chip outer surface (chip sidewall) 19 of the semiconductor device 100; and the chip outer-surface (chip sidewall) 19 is substantially orthogonal with the second end surface of the first semiconductor region 13. At the chip sidewall 19, as shown in FIG. 2, the terminal portions of the p-n junction interface 18 is exposed. In addition, the p-type third semiconductor region 12 has a uniform impurity concentration along the direction of the p-n junction interface 18. However, since the n-type first semiconductor region 13 in contact with this p-type third semiconductor region 12 has an impurity concentration set higher than the n-type fourth semiconductor region 15 surrounding this n-type first semiconductor region 13, when reverse bias voltage is applied to the p-n junction, the breakdown that occurs at the p-n junction happens earlier in the central portion than in the peripheral portion. Therefore, even if some degree of changes in the surface state or surface damage to the chip outer-surface of the semiconductor device 100 occurs, it is possible to suppress changes in the breakdown voltage of the semiconductor device 100. In other words, with the first embodiment, even if there is a portion of the p-n junction interface—between the p-type third semiconductor region 12 and the n-type fourth semiconductor region 15—exposed to the outside, the breakdown of the p-n junction develops in the inner region allowing the externally-exposed portion of the p-n junction to have a structure wherein the high surface electric field intensity cannot affect the device performance. More specifically, the electric field at the sidewall (chip sidewall) of the semiconductor device 100 is reduced and the breakdowns occur in the junction interface within the semiconductor device 100, allowing stable device operation with a stabilized breakdown voltage. In particular, the breakdown of the p-n junction exposed at the edge portion 19 of the chip (the chip outer surface), is dependent on the passivation methodologies of the chip outer surface (chip sidewall) 19 and "variations" in the breakdown voltage at the edge portion 19 of the chip (chip sidewall) is large. However, with the semiconductor device 100 of the first embodiment, since the electric field breakdown occurs earlier in the central portion than the chip outer surface 19, even if there are some changes in the surface state or surface damage that occur at the edge portion (chip sidewall) 19 of the semiconductor device (chip) 100, it is possible to suppress variations in the breakdown voltage of the semiconductor device 100. As a result, with the semiconductor diode 100 of the first embodiment, it becomes possible to eliminate the coating processes involving insulating layers or surface passivation processing such as wet cleansing using an acidic or alkaline chemical in order to protect the chip sidewall 19 from the outside environment. In addition, with the chip sidewall 19, since it is possible to tolerate changes in the surface state or the development of surface damage to a certain extent, the chip becomes easier to handle. Accordingly, variations in the product performance are reduced, and the manufacturing process yield is improved. Such an attempt to stabilize the breakdown voltage in this manner is similarly effective in, for example, a power semiconductor device with a higher rated maximum operating voltage than the voltage regulator diode.

Moreover, since the chip outer-surface 19 is substantially orthogonal with the first end surface of the first semiconductor region 13, it is possible to form the sidewall of the semiconductor device 100 with a typical cutting process, or the dicing process. For example, if an 80° to 100° angle, preferably an 87° to 93° angle is formed with the top/bottom main surfaces (namely p-n junction interface 18), this can be seen as being substantially orthogonal (=90°). If the chip outer-surface 19 is substantially orthogonal with the top/bottom main surfaces, the trouble involved in loading the chip into a jig such as the collet is reduced, and the handling of the semiconductor device (chip) 100 during fabrication (assembly) process is improved.

In addition, with the semiconductor diode 100 of the first embodiment, the breakdown voltage of the centrally-located p-n junction between the buried n-type first semiconductor region 13 and the p-type third semiconductor region 12 can be determined according to the impurity concentration $N_B$ of the n-type first semiconductor region 13. If it is assumed that the p-n junction interface 18 between the p-type third semiconductor region 12 and the n-type first semiconductor region 13 implements a one-sided stepped junction, then the breakdown voltage $V_B$ due to the avalanche breakdown can be given as:

$$V_B = \epsilon_s E_m^2 / (2qN_B) \quad (1)$$

wherein, $\epsilon_s$ is the dielectric constant of the semiconductor substrate, $E_m$ is the maximum electric field intensity inherent to the semiconductor substrate over which the avalanche breakdown is induced, q is the elementary electric charge of the electron, and $N_B$ is the impurity concentration of the first semiconductor region 13. Namely, if the impurity concentration $N_B$ of the first semiconductor region 13 is sufficiently higher than the impurity concentration of the silicon wafer, or more specifically the impurity concentration of the fourth semiconductor region 15, then the breakdown voltage of the semiconductor diode 100 is dependent on only the impurity concentration $N_B$ of the first semiconductor region 13 and not dependent on the impurity concentration of the base material (silicon wafer) used in manufacturing process. As a result, if the impurity concentration $N_B$ of the first semiconductor region 13 is appropriately prescribed in accordance with Eq. (1), and this impurity concentration $N_B$ is maintained, then it is not necessary to precisely control the resistivity ρ of the silicon wafer since the desired breakdown voltage can be obtained. Accordingly, if the substrate has a relatively high resistivity compared to the impurity concentration $N_B$ of the buried first semiconductor region 13, any appropriate commercially available silicon wafer may be used to manufacture a voltage regulator diode 100 having a desired breakdown voltage.

It is noted here that with the first embodiment, it is possible to use for the silicon wafer that having resistivity within the wide range of 1 to 250 Ω·cm (with n-type silicon, corresponding to an impurity concentration in the range of approximately $5.5 \times 10^{15}/cm^3$ to $1.8 \times 10^{13}/cm^3$). Moreover, in the case of a power semiconductor device having high maximum operating voltage, that such as having resistivity ρ within the wide range of 1000 Ω·cm or higher (with n-type silicon, corresponding to an impurity concentration in the range of approximately $5 \times 10^{12}/cm^3$ or lower) may be used.

Next, a method of manufacturing a semiconductor diode 100 of the first embodiment will be described using a sequence of process cross-sectional views shown in FIG. 3A to FIG. 3L.

Figure 3A:
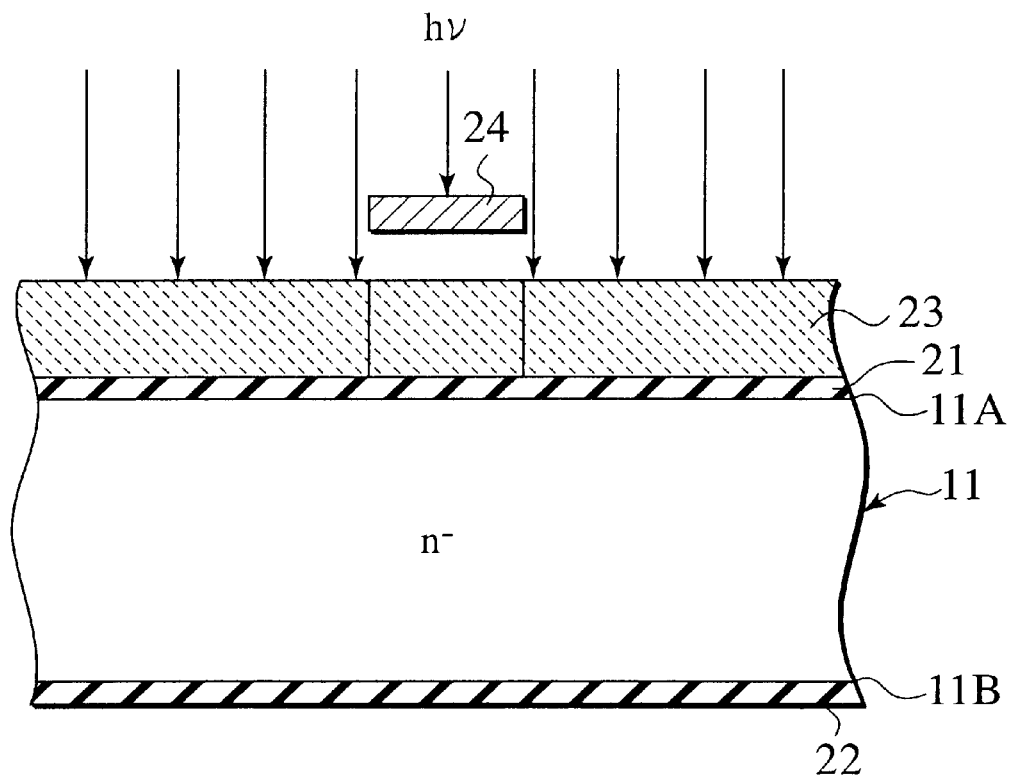
FIGS. 3A to 3L are process cross-sectional views showing a manufacturing method of the semiconductor device according to the first embodiment of the present invention, respectively.

(I) To begin with, a silicon substrate (silicon wafer) of a first conductivity type (n-type) is prepared as shown in FIG. 3A. Then a first main surface 11A and a second main surface 11B of this silicon substrate 11 are both subjected to thermal oxidation, forming respective silicon oxide ($SiO_2$) layers 21, 22 having a thickness of 300 nm to 1.5 μm. Afterwards, using a photolithographic technique, delineating processing is performed on the silicon oxide layer 21 formed on the first main surface 11A side. More specifically, as shown in FIG. 3A, a negative photoresist 23, for example, is applied onto the silicon oxide layer 21 using a technique such as spin-coating. Next, as shown in FIG. 3A, an opening 23A, which is described later, is delineated, and a photo mask having opaque patterns 24 for covering the portions to be processed (in order to form an n-type first semiconductor region 13) is positioned, and is exposed with an exposure light.

Figure 3B:
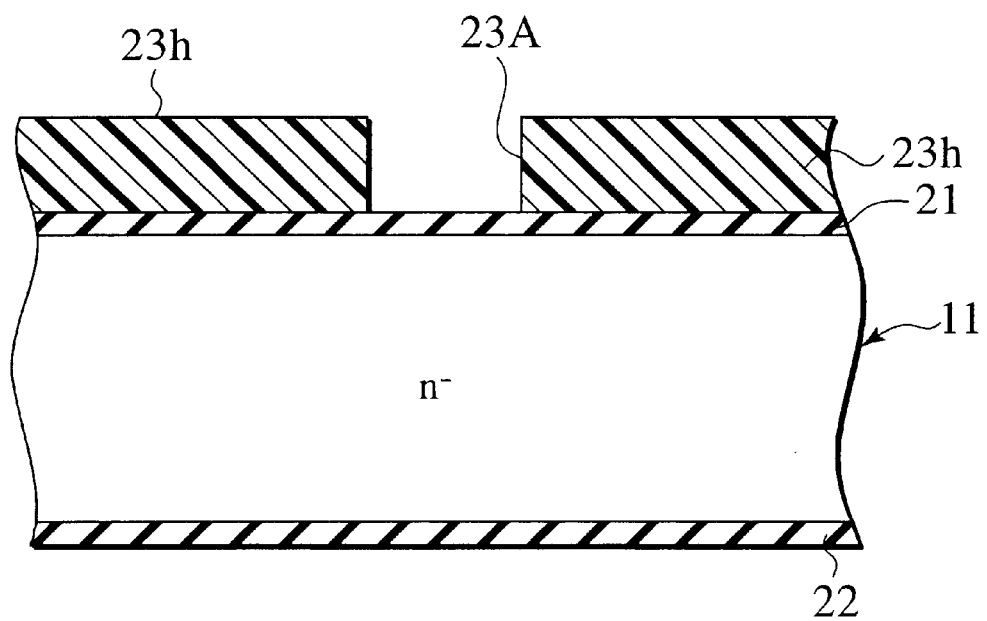
Figure 3C:
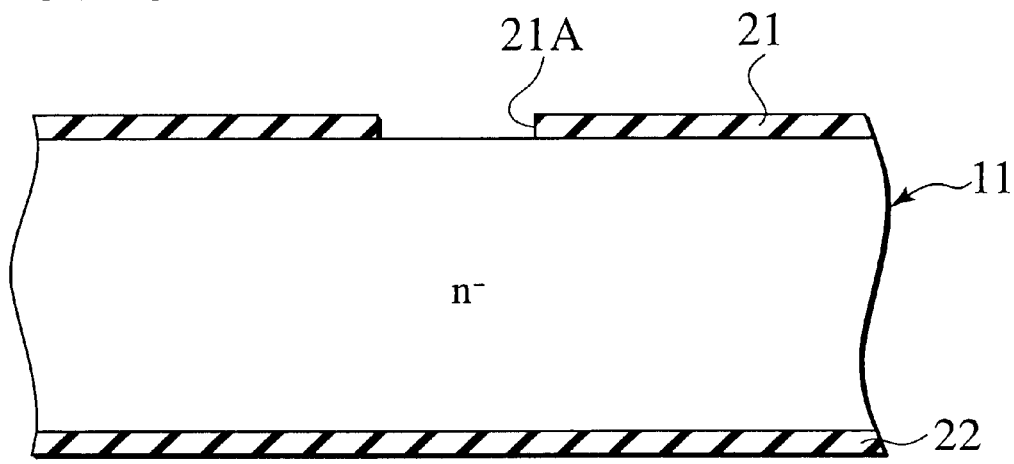

(II) FIG. 3B illustrates the developed state after the exposure of the photoresist 23. Using a photoresist 23 having such patterning as an etching mask, wet etching or dry etching is performed, and the silicon oxide layer 21 exposed within the opening 23A of the photoresist 23 is etched to expose a portion of the top surface of the silicon substrate 11. FIG. 3C shows the resultant state once the photoresist 23 is removed. Namely, as shown in FIG. 3C, a diffusion window 21A is cut in the silicon oxide layer 21.

Figure 3D:
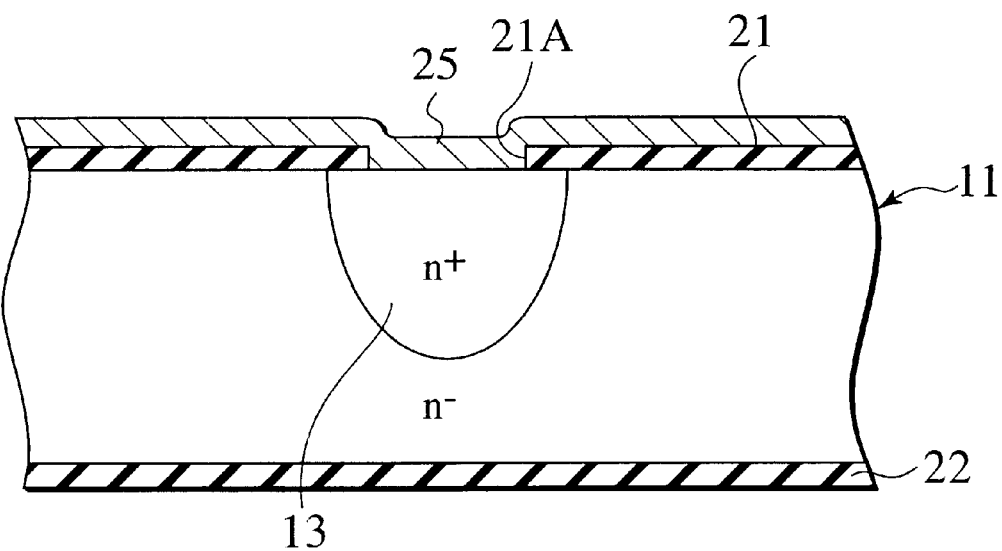
Figure 3E:
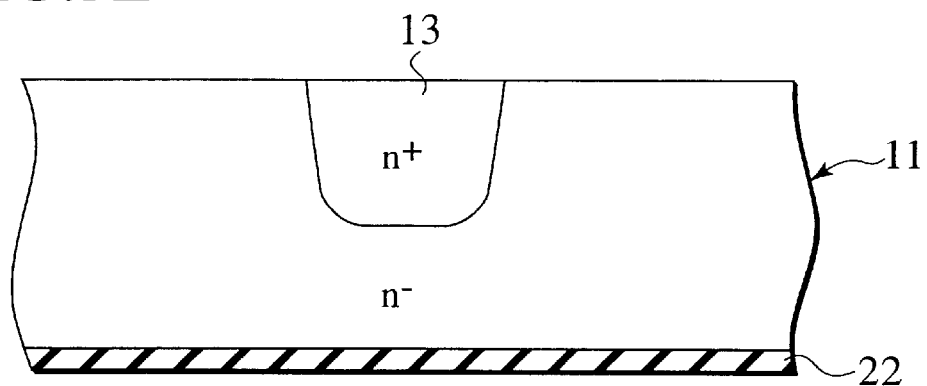

(III) Next, as shown in FIG. 3D, upon the silicon substrate 11 whereto the diffusion window 21A has been formed in the silicon oxide layer 21, an impurity doped film 25, for example a phosphorus glass (PSG) film or an arsenic glass (AsSG) film that has been heavily doped with the respective impurity, which may include n-type impurities phosphorus (P) or arsenic (As), is deposited using, for example, chemical vapor deposition (CVD) method. An n-type semiconductor region (first semiconductor region) 13 having a high impurity concentration is then formed to a predetermined diffusion depth by performing selective diffusion employing annealing processing at a predetermined diffusion temperature and for a predetermined length of diffusion time. Since the depth of the diffusion of the first semiconductor region 13 ultimately becomes a depth that is approximately half the thickness of the silicon substrate 11, it is preferable that phosphorus (P), which has a large diffusion coefficient, be used as the n-type impurity element. In particular, when forming a p-type third semiconductor region 12, which is described later, it is preferable that an n-type impurity element having a larger diffusion coefficient than the diffusion coefficient of the p-type impurity element be selected. A vapor phase diffusion method using a liquid source such as phosphoryl chloride ($POCl_3$), and without using the impurity doped film, is also allowable. In addition, it is also allowable to implant, with a predetermined dosage such as between $3 \times 10^{15}$ $cm^{-2}$ and $5 \times 10^{16}$ $cm^{-2}$, impurity ions such as $^{31}P^+$ and afterwards drive it in, using annealing processing, to a predetermined diffusion depth. It is also allowable to implant ions of $^{75}As^+$; however, due to the small diffusion coefficient of As, it takes a long time to obtain the desired diffusion depth and is therefore not preferred. In the case where an impurity doped film 25 is used, thereafter as shown in FIG. 3E, wet etching or dry etching is used to remove the impurity doped film 25 and the silicon oxide film 21. In the case as well where an impurity doped film 25 is not used, as shown in FIG. 3E, wet etching or dry etching is performed to remove PSG or the like formed during the driving-in process and the silicon oxide film 21.

Figure 3F:
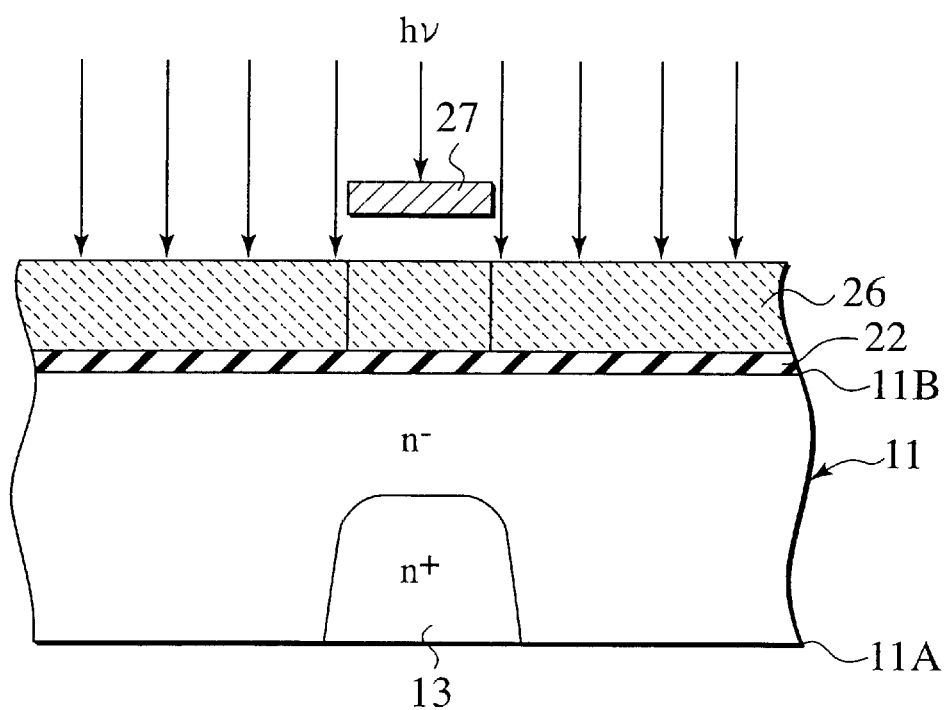

(IV) The entire surface of the first main surface 11A of this silicon substrate 11 is subjected to a thermal oxidization, and a silicon oxide layer (omitted from the figures) having a thickness of 300 nm to 500 nm is formed. At this point, the thickness of the silicon oxide layer 22 on the second main surface 11B of the silicon substrate 11 becomes somewhat thicker. Continuing, as shown in FIG. 3F, for example, a negative photo resist 26 is applied onto the silicon oxide layer 22 formed on the second main surface 11B of the silicon substrate 11 using a process such as spin-coating. Next, planning to cut a diffusion window 22A, which is described later, a photo mask having opaque pattern 27 for covering the portion corresponding to the diffusion window 22A, which will be used to form an n-type second semiconductor region 14, is positioned, and the negative photo resist 26 is exposed with an exposure light through the photo mask.

Figure 3G:
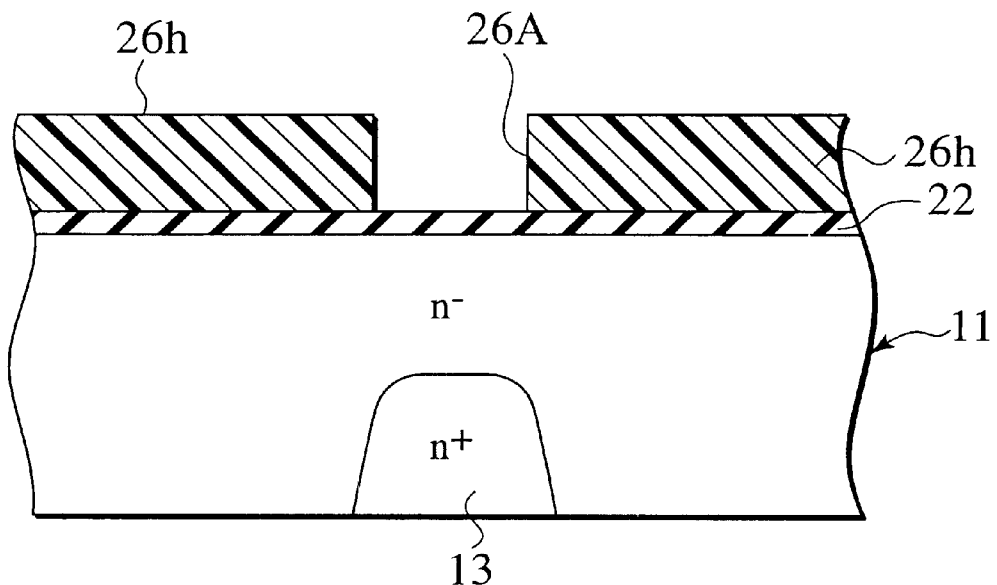

(V) FIG. 3G illustrates the post-exposure/developed state of the photo resist 26. The photo resist 26 having this topology of patterning is used as an etching mask to perform wet etching or dry etching. And a portion of the silicon oxide layer 22, exposed within the opening 26A in the photo resist 26, is selectively removed so as to exposes a portion of the top surface of the silicon substrate 11, forming the diffusion window 22A in the silicon oxide layer 22. After this, the photo resist 26 is removed.

Figure 3H:
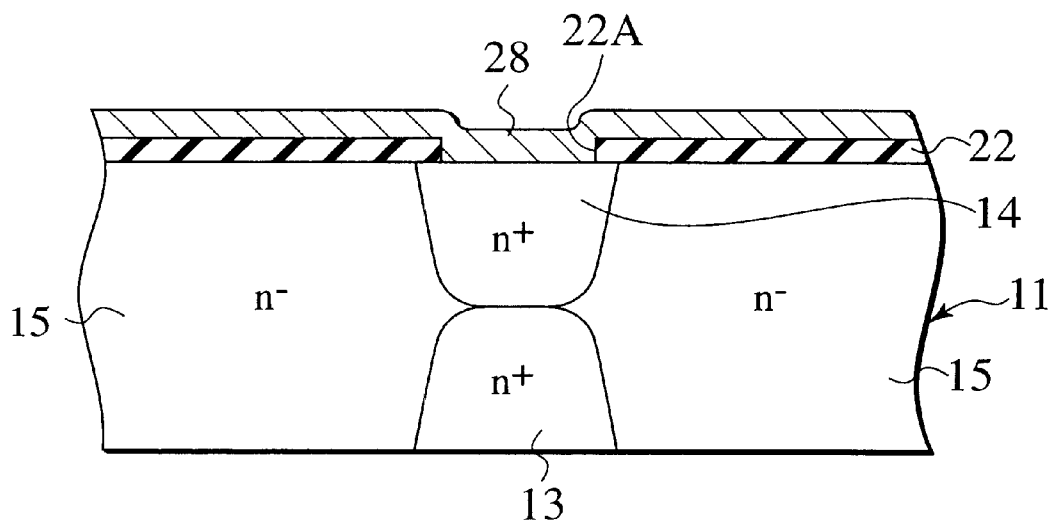
Figure 3I:
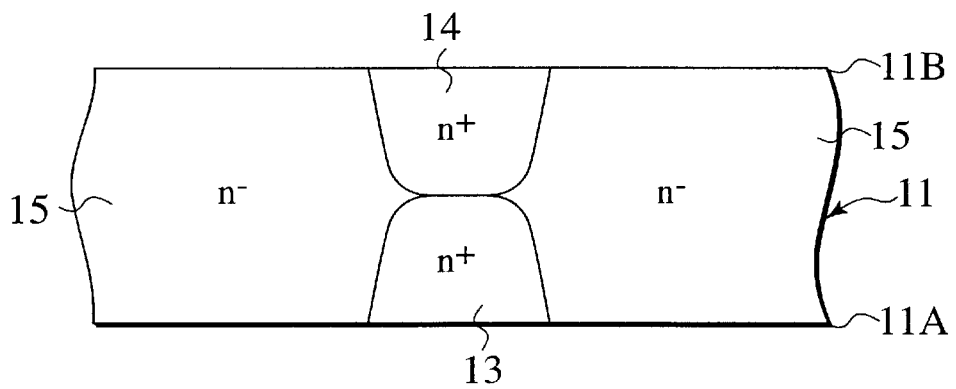

(VI) Next, as shown in FIG. 3H, upon the silicon substrate 11 whereto the diffusion window 22A has been formed in the silicon oxide layer 22, an impurity doped film 28, for example a PSG film or an arsenic glass (AsSG) film that has been heavily doped with respective impurities, which may include n-type impurities phosphorus (P) or arsenic (As), is deposited. An n-type second semiconductor region 14 having a high impurity concentration is then formed to a predetermined diffusion depth by performing selective diffusion via the diffusion window 22A by drive-in processing, or annealing processing at a predetermined diffusion temperature and for a predetermined length of diffusion time so as to come in contact with the n-type first semiconductor region 13. In FIG. 3H, the state where the first semiconductor region 13 and the n-type second semiconductor region 14 are in complete contact is shown; however, in reality, at this stage it is acceptable for an intervening layer made of the silicon substrate 11 to remain between the first semiconductor region 13 and n-type second semiconductor region 14. However, the thickness of the intervening layer made of the silicon substrate 11 sandwiched between the first semiconductor region 13 and n-type second semiconductor region 14 becomes thinner and thinner, since both of the first semiconductor region 13 and n-type second semiconductor region 14 are pushed in deeper and deeper during the thermal process required for forming a p-type third semiconductor region 12, which is described later, on the entire surface (see FIG. 3J). Therefore, the remaining thickness of the intervening layer 11 must be elected such that the first semiconductor region 13 and n-type second semiconductor region 14 can ultimately mate each other so as to form a complete metallurgical contact between them. In either case, since the diffusion depth in the second semiconductor region 14 is ultimately approximately half the thickness of the silicon substrate 11, it is preferable that phosphorus (P) be used as the n-type impurity element. Thereafter, as shown in FIG. 3I, impurity doped layer 28 and silicon oxide layer 22 are subjected to wet etching or dry etching so as to be removed. At this point, the region surrounding the n-type first semiconductor region 13 and second semiconductor region 14 becomes the n-type fourth semiconductor region 15, which retains the impurity concentration inherent to the silicon substrate 11. It is noted here that the impurity concentration of the n-type second semiconductor region 14 may be set at approximately $2\times10^{19}/cm^3$. In addition, the depth of the n-type second semiconductor region 14 may be controlled so that a predetermined amount of junction area between the second semiconductor region 14 and the first semiconductor region 13 is obtained, through selective diffusion from a main surface side of the silicon substrate 11. A vapor phase diffusion method using a liquid source such as $POCl_3$, without using the impurity-doped film, is also allowable. In addition, it is also allowable to implant a predetermined dosage of, such as between $3\times10^{15}$ $cm^{-2}$ and $5\times10^{16}$ $cm^{-2}$, impurity ions such as $^{31}P^+$ and afterwards drive the implanted impurity ions in to a predetermined diffusion depth by annealing processing.

Figure 3J:
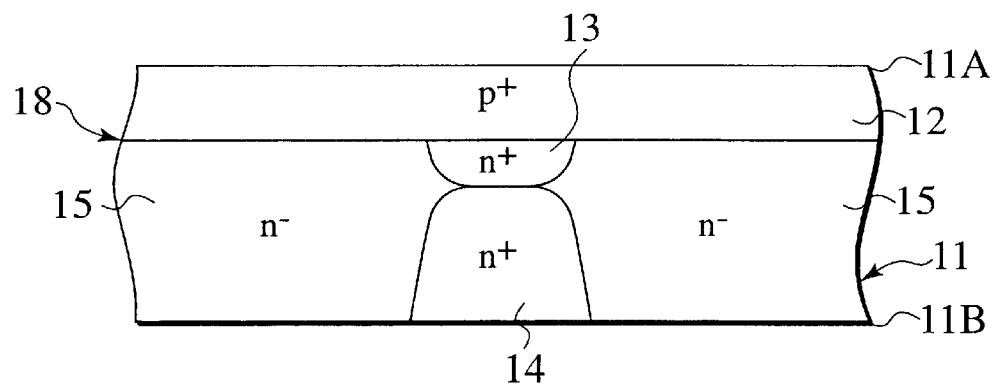

(VII) Next, the entire surfaces of both the first main surface 11A and the second main surface 11B of the silicon substrate 11 are subjected to oxidation to form a silicon oxide layer (omitted from the figures) having a thickness of 350 nm to 1.5 µm. A photo resist is then applied to the second main surface 11B of the silicon substrate 11, and only the silicon oxide layer on the first main surface 11A side of the silicon substrate 11 is removed. Through this, as shown in FIG. 3J, an acceptor impurity such as boron (B), for example, may be diffused from the first main surface 11A side of the silicon substrate 11 using a blanket surface diffusion method, and form a p-type third semiconductor region 12 having a predetermined high impurity concentration at the entire surface by performing a driving-in (annealing processing) process for a predetermined length of diffusion time. The blanket surface diffusion of the acceptor impurity may be accomplished with a method using an impurity doped film such as BSG film or with a vapor phase diffusion method using a solid source such as boron nitride (BN), or a liquid source such as boron tribromide ($BBr_3$). In addition, it is also allowable to implant with a predetermined dosage of, for example, between $3\times10^{15}$ $cm^{-2}$ and $5\times10^{16}$ $cm^{-2}$, an impurity ions such as $^{11}B^+$ or $^{49}BF_2^+$ and afterwards drive the impurity ions in, using annealing processing, to a predetermined diffusion depth. Once the driving-in (annealing processing) process is finished, the BSG film served as the impurity doped film or generated by the driving-in process on the first main surface 11A of the silicon substrate 11 is removed; moreover, the silicon oxide layer (omitted from the figures) on the second main surface 11B of the silicon substrate 11 is removed. As a result, as shown in FIG. 3J, this p-type third semiconductor region 12 and the centrally located n-type semiconductor region 13 come into contact and form a p-n junction interface 18. In addition, the remaining n-type semiconductor region 15, surrounding the n-type semiconductor region 13 and the n-type second semiconductor region 14 formed in the central portion through selective diffusion, also forms a p-n junction with the p-type third semiconductor region 12. As described earlier, at the stage shown in FIG. 3H, the intervening layer made of the silicon substrate 11 has remained between the first semiconductor region 13 and n-type second semiconductor region 14. However, when the blanket surface diffusion process of the third semiconductor region 12 shown in FIG. 3J is performed, the first semiconductor region 13 and n-type second semiconductor region 14 are further pushed deeper and deeper so as to reach each other. As a result, at this stage, the first semiconductor region 13 and n-type second semiconductor region 14 come to be in complete contact. Namely, by simultaneously performing the thermal diffusion (driving-in) processing of the n-type impurity elements for forming the second semiconductor region 14 and the thermal diffusion (driving-in) processing of the p-type impurity elements for forming the third semiconductor region 12, the efficiency with which the semiconductor device is manufactured can be improved. It is noted here that deposition of the p-type third semiconductor region 12 through epitaxial growth can also be used for the method of forming the p-type third semiconductor region 12 on the entire surface. For example, in FIG. 3J, it is allowable to perform vapor-phase epitaxial growth of the p-type third semiconductor region 12 while supplying a p-type dopant such as diborane ($B_2H_6$) onto the first main surface 11A of the silicon substrate 11, using a source gas such as monosilane ($SiH_4$) gas, dichlorosilane ($SiH_2Cl_2$) gas, and silicon chloride ($SiCl_4$) gas.

Figure 3K:
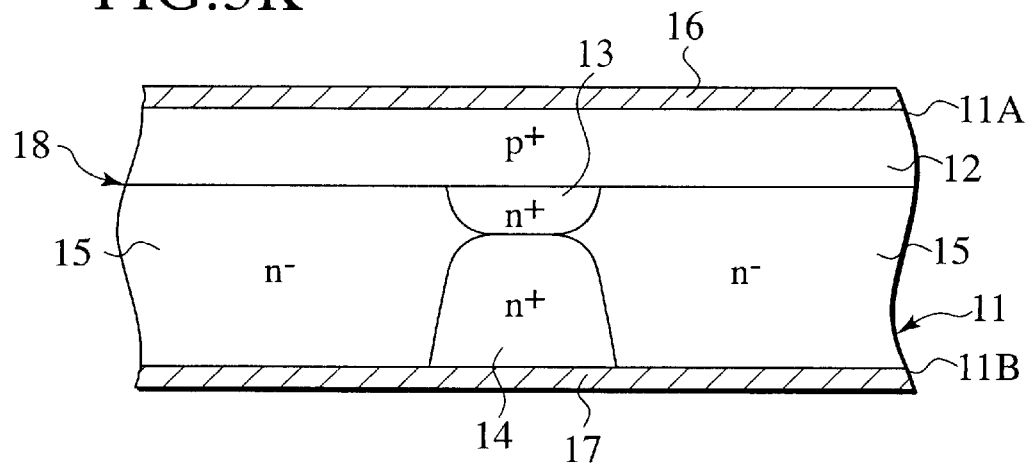

(VIII) Moreover, as shown in FIG. 3K, a thin metal film is deposited on both main silicon surfaces 11A and 11B of the silicon substrate 11 using a vacuum evaporation process or a sputtering process to form a first main electrode layer 16 and a second main electrode layer 17 with a thickness of approximately 1 µm to 10 µm.

Figure 3L:
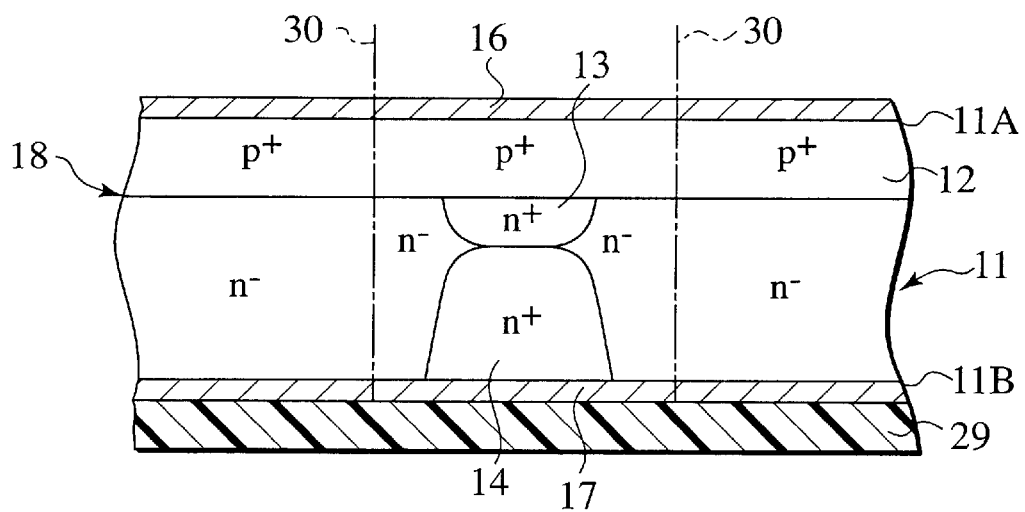

(IX) Afterwards, as shown in FIG. 3L, a synthetic resin sheet 29 is applied, for example, across the entire second main surface 11B of the silicon substrate 11, and dicing is performed along the dicing line 30 shown in FIG. 3L by the dashed line. A chip so formed by this dicing process can be used as the semiconductor diode 100 shown in FIG. 2. It is noted here that after the dicing process, the chip-shaped semiconductor diode 100 can be stored/transported while being adhered to the synthetic resin sheet 29. This allows for easy handling when loading the semiconductor diodes 10 adhered to the synthetic resin sheet 29 into a jig, such as the collet, during performing product assembly.

According to the manufacturing method of the semiconductor device of the first embodiment, since the chip sidewall 19 of the semiconductor diode 100 are cut by the chip sidewall 19 dicing process, it is possible to make the p-n junction interface 18 orthogonal with the chip sidewall 19. As a result, the various additional processes for forming the conventional beveled structure are not required, making it possible to greatly reduce the number of manufacturing processes.

(Second Embodiment)

Figure 4:
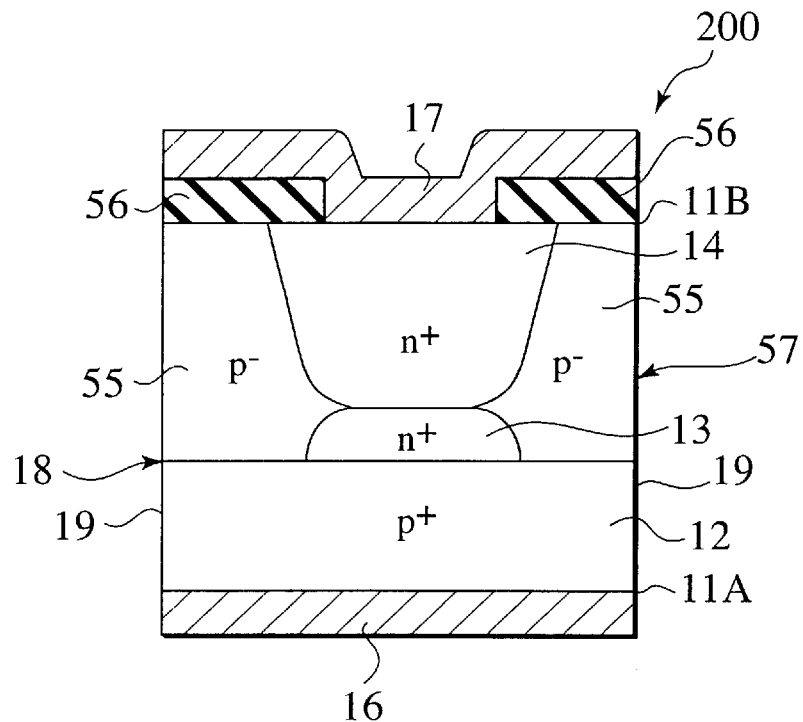
FIG. 4 is a cross-sectional view showing a semiconductor device according to the second embodiment of the present invention.

As shown in FIG. 4, a semiconductor diode 200 according to a second embodiment of the present invention corresponds the structure having fourth semiconductor region 15 with a conductivity type that is the opposite as that of the semiconductor diode 100 explained in the first embodiment.

Namely, the semiconductor diode 200 of the second embodiment embraces a buried first semiconductor region 13 of a first conductivity-type, a second semiconductor region 14 of the first conductivity-type disposed on the first semiconductor region 13, a slab-like third semiconductor region 12 of a second conductivity-type disposed under the first semiconductor region 13 and a fourth semiconductor region 55 of the second conductivity-type. Here, the second conductivity type is the opposite conductivity type as the first conductivity type. The first semiconductor region 13 includes a first end surface, a second end surface opposite the first end surface and a first outer surface connecting the first and second end surfaces. As shown in FIG. 4, the first outer surface is a curved surface having a certain radius of curvature with its top-portion convex. The second semiconductor region 14 has a third end surface, a fourth end surface facing the third end surface and a second outer surface connecting the third and fourth end surfaces; wherein the fourth end surface is in contact with the first end surface of the first semiconductor region 13. As shown in FIG. 4, the second outer surface is a curved surface having a certain radius of curvature with its bottom portion convex. In addition, a third semiconductor region 12 is in contact with the first semiconductor region 13 at the second end surface of the first semiconductor region 13. Moreover, the fourth semiconductor region 55 has inner surface in contact with the first and second outer surfaces, and additionally in contact with the third semiconductor region 12. Accordingly, the inner surface of the fourth semiconductor region 55 is a curved surface resembling a mortar shape having two or more certain radii of curvature.

With the semiconductor device of the second embodiment, the first conductivity type is assigned to be n-type, and the second conductivity type is p-type. However, it is understood, the first conductivity type may be assigned to p-type and the second conductivity type n-type. As shown in FIG. 4, the fourth semiconductor region 55 has a lower impurity concentration than the first semiconductor region 13. The n-type first semiconductor region 13 having a high impurity concentration is in contact with the p-type third semiconductor region 12 to provide a p-n junction interface at that interface (alternatively, the reverse, where a p-type first semiconductor region 13 having a high impurity concentration is in contact with the n-type third semiconductor region 12 to provide a p-n junction interface, is also allowable).

More specifically, in the semiconductor diode of the second embodiment, a p-type third semiconductor region 12 is formed at the first main surface 11A side of the silicon substrate 11 of the first conductivity type (n-type); and the n-type second semiconductor region 14 is selectively formed at the second main surface 11B side. Within the silicon substrate 11, the n-type first semiconductor region 13 is buried so as to be in contact with the p-type third semiconductor region 12 at a place along a p-n junction interface 18. Moreover, the buried n-type first semiconductor region 13 and the n-type second semiconductor region 14 are in contact in a deep place within the silicon substrate 11. In addition, the p-type fourth semiconductor region 55 is formed enclosing the n-type first semiconductor region 13 and the second semiconductor region 14. The p-n junction interface formed between the p-type fourth semiconductor region 55 and the n-type second semiconductor region 14 is exposed at the second main surface 11B side of the silicon substrate 11.

In the second embodiment, on the bottom surface of the third semiconductor region 12, a first main electrode layer 16 is formed, and on the top surface of the of the second semiconductor region 14, a second main electrode layer 17 is formed. However, unlike in FIG. 2, the second main electrode layer 17 and the p-type fourth semiconductor region 55 is electrically insulated by a field insulating film (field silicon oxide film) 56. The p-n junction interface formed between the p-type fourth semiconductor region 55 and the n-type second semiconductor region 14, exposed at the second main surface 11B side of the silicon substrate 11 is covered with a field insulating film (field silicon oxide film) 56 so as to insulate the p-n junction interface from air. In addition, employing the contact window provided in the insulating film (field silicon oxide film) 56 an ohmic contact between the top surface of the second semiconductor region 14 and the second main electrode layer 17 is implemented. The first main electrode layer 16 and the second main electrode layer 17 identify the operational region, which is the main current path of the semiconductor element. In the case where the third semiconductor region 12 is assigned to be p-type, the first main electrode layer 16 is identified as an anode electrode layer, and since the second semiconductor region 14 is assigned to be n-type, the second main electrode layer 17 is identified as a cathode electrode layer. As a result, the third semiconductor region 12 serves as a "first main electrode region (anode region)" contacting to the first main electrode layer 16, and the second semiconductor region 14 serves as a "second main electrode region (cathode region)" contacting to the second main electrode layer 17.

The p-type fourth semiconductor region 55, which is formed so as to enclose the perimeters of both the n-type first semiconductor region 13 and the second semiconductor region 14, are scheduled to have a relatively low impurity concentration inherent to the silicon substrate 57. Namely, the n-type first semiconductor region 13 and the second semiconductor region 14 are prescribed to have a high impurity concentration relative to the p-type fourth semiconductor region 55 there surrounding.

In the semiconductor device 200 according to the second embodiment, the fourth semiconductor region 55 is made of a p-type semiconductor wafer 57 provided by a wafer, which is cut from bulk crystal grown using a process such as FZ, CZ, or MCZ method. By adjusting the impurity concentration in the first semiconductor region 13, it is possible to control the electrical performances (breakdown voltage) of the semiconductor device 200, and it is possible to make it so that the impurity concentration of the fourth semiconductor region 55 does not influence the electrical performances of the semiconductor device 200. As a result, it is possible to use the fourth semiconductor region 55 with the doping specifications of the wafer (semiconductor substrate) 57 as it is when it is cut from bulk crystal at the time of purchase. Namely, there is no longer any need to strictly set the doping specifications of the semiconductor substrate 57 and it is possible to widen the range from which the semiconductor substrate (wafer) 57 to be used may be chosen.

In the semiconductor device 200 according to the second embodiment, the outer surface of the fourth semiconductor region 55 serves as a chip outer surface (chip sidewall) 19 of the semiconductor device 200, and the chip outer-surface (chip sidewall) 19 are substantially orthogonal with the second end surface of the first semiconductor region 13. Since the p-n junction interface formed between the p-type fourth semiconductor region 55 and the n-type second semiconductor region 14 is exposed at the second main surface 11B side of the silicon substrate 57, at the chip sidewall 19, unlike FIG. 4, the end portion of the p-n junction interface 18 is not exposed. As a result, even if some degree of changes in the surface state or surface damage to the chip outer-surface of the semiconductor device 200 occurs, there is no influence on changes in the breakdown voltage of the semiconductor device 200. In particular, the breakdown of the p-n junction exposed at the edge portion (the chip outer surface) 19 of the earlier chip was dependent on the passivation architecture of the chip outer surface (chip sidewall) 19 and "variations" in the breakdown voltage at the edge portion (chip sidewall) 19 of the earlier chip was large. However, with the semiconductor device 200 according to the second embodiment, since the terminal portion of the p-n junction interface 18 is not exposed, even if there are some changes in the surface state or surface damage occurs at the edge portion (chip sidewall) 19 in the semiconductor device 200 (chip), it has no bearing on the change in the breakdown voltage of the semiconductor device 200.

In addition, since the impurity concentration of the n-type first semiconductor region 13 in contact with the p-type third semiconductor region 12 is set higher than that of the p-type fourth semiconductor region 55 surrounding the n-type first semiconductor region 13, when a reverse bias voltage is applied between the anode electrode layer 16 and the cathode electrode layer 17, the breakdown at the p-n junction between the p-type third semiconductor region 12 and the n-type first semiconductor region 13 occurs earlier than the breakdown at the p-n junction between the p-type fourth semiconductor region 55 and the n-type first semiconductor region 13, and the p-n junction between the p-type fourth semiconductor region 55 and the n-type second semiconductor region 14. Namely, with the second embodiment, even if there is a portion of the p-n junction interface, between the n-type second semiconductor region 14 and the p-type fourth semiconductor region 55, is exposed at the second main surface 11B side of the silicon substrate 57, the breakdown of the p-n junction develops within the inner region, and it is configured such that high surface electric field is not applied to the p-n junction at the second main surface 11B side of the silicon substrate 57. More specifically, the electric field at the second main surface 11B side of the silicon substrate 57 is reduced and the breakdown is made to occur in the junction interface within the semiconductor device 200 so that there can be stabilization of the device performance ascribable to the constant breakdown voltage.

As a result, with the semiconductor diode 200 according to the second embodiment, it is possible to eliminate or reduce the need for coating processing using an insulating film or surface passivation processing such as wet cleansing using an acidic or alkaline chemical in order to protect the chip sidewall 19 from the external environment. In addition, with the chip sidewall 19, since the changes in the surface state or surface damage is allowable to a certain extent, handling of the chip is made easier. Accordingly, variations in the resultant product performances are reduced, improving process yields. Such stabilization of the device performance ascribable to the constant breakdown voltage, in this manner, is similarly effective in, for example, a power semiconductor device with a higher breakdown voltage than the voltage regulator diode. Moreover, since the chip outer-surface 19 is substantially orthogonal with the first end surface of the first semiconductor region 13, it is possible to form the sidewall of the semiconductor device 200 with a typical cutting process (dicing process). If the chip outer-surface 19 is substantially orthogonal with the top/bottom main surfaces, the trouble involved in loading the chip into a jig such as the collet is reduced, and the handling of the semiconductor device 200 during fabrication (assembly) processes is improved.

If the impurity concentration $N_B$ of the first semiconductor region 13 is sufficiently higher than the impurity concentration of the fourth semiconductor region 55, then, as shown in Eq. (1), the breakdown voltage of the semiconductor diode 200 is dependent on only the impurity concentration $N_B$ of the first semiconductor region 13 and not dependent on the impurity concentration of the base material (silicon wafer) used in manufacturing process. As a result, there is no need to precisely control the resistivity ρ of the silicon wafer 57. Accordingly, if the substrate 57 has a relatively high resistivity compared to the impurity concentration $N_B$ of the buried first semiconductor region 13, then any appropriate, commercially available silicon wafer 57 may be used to manufacture a voltage regulator diode 200 having the desired breakdown voltage.

The manufacturing method of the semiconductor diode 200 according to the second embodiment, is essentially the same as the manufacturing method of the semiconductor diode 200 of the first embodiment shown in the sequence of the process cross-sectional views shown in FIGS. 3A to FIG. 3L. However, in FIG. 3A, it is necessary to prepare a silicon substrate (silicon wafer) 57 having the second conductivity type (p-type) with a relatively high resistivity.

In addition, the sequence of the manufacturing processes is performed in exactly the same manner as the sequence of the process cross-sectional views shown in FIG. 3A to FIG. 3J until reaching the stage shown in FIG. 3J. FIG. 3J shows the state of the wafer 57 once the driving-in (annealing processing) process is finished and the BSG film and the like that has developed due to the impurity doped film or driving-in through the first main surface 11A of the silicon substrate 57 or the silicon oxide film (omitted from the figures) on the second main surface 11B is removed.

After this, both the first main surface 11A and the second main surface 11B of the silicon substrate 57 are subjected to a thermal oxidizing, and respective field silicon oxide films 56 each having a thickness of 600 nm to 1.5 μm are formed. Thereafter, using a photolithography technique followed by an etching technique, a contact window is opened in the field-silicon oxide film 56 formed on the second main surface 11B side. The field-silicon oxide film 56 formed on the first main surface 11A is completely removed.

Next, in the same manner as shown in FIG. 3K, a thin metal film is deposited on both of the main surfaces 11A, 11B of the silicon substrate 57 through a vacuum evaporation process or sputtering process forming a first main electrode layer 16 and second main electrode layer 17 with a thickness of approximately 1 μm to 10 μm.

The subsequent processes are similar to the sequence of the processes from FIG. 3L of the first embodiment onward and therefore the respective descriptions are omitted.
(Third Embodiment)

The semiconductor diode 300 according to a third embodiment of the present invention corresponds to a configuration wherein the n-type fourth semiconductor region 15 in the first embodiment is changed to an intrinsic (i-type) semiconductor region.

Figure 5:
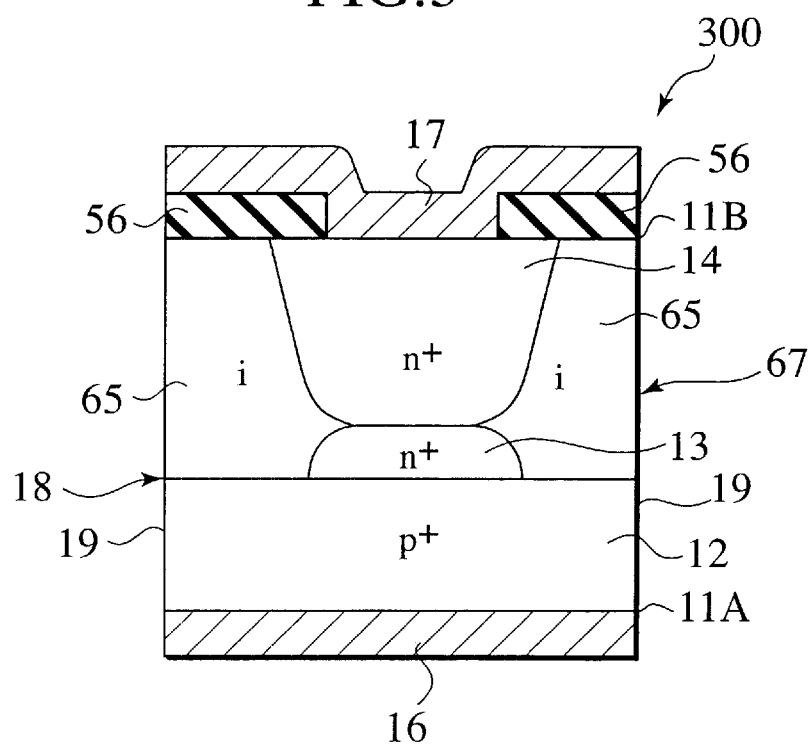
FIG. 5 is a cross-sectional view showing a semiconductor device according to the third embodiment of the present invention.

More specifically, as shown in FIG. 5, a semiconductor diode 300 of the third embodiment embraces a buried first semiconductor region 13 of a first conductivity-type, a second semiconductor region 14 of the first conductivity-type disposed on the first semiconductor region 13, a slab-like third semiconductor region 12 of a second conductivity-type disposed under the first semiconductor region 13, and a fourth semiconductor region 65 made of the intrinsic (i-type) semiconductor region surrounding the first semiconductor region 13 and the second semiconductor region 14. Here, the second conductivity type is the opposite conductivity type as the first conductivity type. And the "intrinsic semiconductor region" can include the semiconductor region having the impurity concentration in the range of approximately $1 \times 10^{13}/cm^3$ or lower. The semiconductor region called "ν region" or "π region" may also be included in the intrinsic semiconductor region. The first semiconductor region 13 embraces a first end surface, a second end surface facing the first end surface and a first outer surface connecting the first and second end surfaces. The first outer surface of the first semiconductor region 13 is, as shown in FIG. 5, a curved surface having a certain radius of curvature with its top portion convex. The second semiconductor region 14 has a third end surface, a fourth end surface facing the third end surface and a second outer surface connecting the third and fourth end surfaces; wherein the fourth end surface is in contact with the first end surface of the first semiconductor region 13. The second outer surface is, as shown in FIG. 5, a curved surface having a certain radius of curvature with is bottom portion convex. In addition, the third semiconductor region 12 is in contact with the buried first semiconductor region 13 at the second end surface of the first semiconductor region 13. Moreover, the fourth semiconductor region 65 has inner surface in contact with the first and second outer surfaces, and additionally has a bottom surface in contact with the third semiconductor region 12. Accordingly, the inner surface of the fourth semiconductor region 65 is a curved surface resembling a mortar shape having two or more certain radii of curvature.

With the semiconductor device of the third embodiment, the first conductivity type is assigned to be n-type and the second conductivity type is assigned to be p-type. However, needless to say, the first conductivity type may be assigned to p-type and the second conductivity type may be n-type. Since it is an intrinsic (i-type) semiconductor region, the fourth semiconductor region 65 may have the impurity concentration, which is much lower than that of the first semiconductor region 13. The n-type first semiconductor region 13 having the high impurity concentration is in contact with the p-type third semiconductor region 12 to provide a p-n junction interface at the bottom of the first semiconductor region 13. Alternatively, a p-type first semiconductor region 13 having a high impurity concentration can be in contact with the n-type third semiconductor region 12 to provide a p-n junction interface at the bottom of the first semiconductor region 13.

More specifically, in the semiconductor diode of the third embodiment, a p-type third semiconductor region 12 is formed at the first main surface 11A side of the silicon substrate 67 of the intrinsic type, and an n-type second semiconductor region 14 is selectively formed at the second main surface 11B side. Within the silicon substrate 67, the n-type first semiconductor region 13 is buried so as to be in contact with the p-type third semiconductor region 12 at a place along a p-n junction interface 18. Moreover, the n-type first semiconductor region 13 and the n-type second semiconductor region 14 are in contact in a deep place within the silicon substrate 67. Then, the i-type fourth semiconductor region 65 encloses the n-type first semiconductor region 13 and the second semiconductor region 14. The flat i-p junction interface formed between the i-type fourth semiconductor region 65 and the p-type third semiconductor region 12, is exposed on the chip sidewall 19 of the silicon substrate 67. In addition, the curved n-i junction interface formed between the i-type fourth semiconductor region 65 and the n-type second semiconductor region 14 is exposed at the second main surface 11B side of the silicon substrate 67; however, the p-n junction interface is exposed at neither the sidewall of the silicon substrate (chip) 67, the first main surface 11A, nor the second main surface 11B.

In the third embodiment, on the bottom surface of the third semiconductor region 12, a first main electrode layer 16 is formed, and on the top surface of the second semiconductor region 14, a second main electrode layer 17 is formed. However, unlike in FIG. 2, the second main electrode layer 17 and the i-type fourth semiconductor region 65 are electrically insulated with a field insulating film (field-silicon oxide film) 56. The n-i junction interface formed between the i-type fourth semiconductor region 65 exposed at the second main surface 11B side of the silicon substrate 67 and the n-type second semiconductor region 14 is covered with a field-insulating film (field-oxidizing film) 56 so as to insulate the n-i junction interface from air. In addition, employing the contact window provided in the field-insulating film (field-silicon oxide film) 56, an ohmic contact between the top surface of the second semiconductor region 14 and the second main electrode layer 17 is implemented. With the first main electrode layer 16 and the second main electrode layer 17, the operational region, which is the main current path of the semiconductor device, is identified. In the case where the third semiconductor region 12 is assigned to be p-type, the first main electrode layer 16 is an anode electrode layer, and since the second semiconductor region 14 is n-type, the second main electrode layer 17 is a cathode electrode layer. As a result, the third semiconductor region 12 serves as a "first main electrode region (anode region)" contacted to the first main electrode layer 16, and the second semiconductor region 14 serves as a "second main electrode region (cathode region)" contacted to the second main electrode layer 17.

The i-type fourth semiconductor region 65 formed so as to enclose the perimeters of both the n-type first semiconductor region 13 and the second semiconductor region 14 are prescribed to have an extremely low impurity concentration inherent to the silicon substrate 67. Namely, the n-type first semiconductor region 13 and the second semiconductor region 14 are prescribed to have a high impurity concentration approximately five figures larger than the i-type fourth semiconductor region 65 theresurrounding.

In the semiconductor device 300 of the third embodiment, the fourth semiconductor region 65 is an i-type semiconductor substrate 67 made of a wafer 57 cut from bulk crystal grown using a process such as FZ, CZ, or MCZ method. By adjusting the impurity concentration of the first semiconductor region 13, it is possible to control the electrical performances (breakdown voltage) of the semiconductor device 300, and it is possible to make it so that the impurity concentration of the fourth semiconductor region 65 does not influence the electrical performances of the semiconductor device 300. As a result, it is possible to use the fourth semiconductor region 65 with the doping specifications of the wafer (semiconductor substrate) 67 as it is when it is cut from bulk crystal at the time of purchase. Namely, there is no longer any need to strictly set the doping specifications of the semiconductor substrate 67 and it is possible to widen the range from which the semiconductor substrate (wafer) 67 to be used may be chosen.

In the semiconductor device 300 of the third embodiment, the outer surface of the fourth semiconductor region 65 serves as chip outer surface (chip sidewall) 19 of the semiconductor device 300, and the chip outer-surface 19 is substantially orthogonal with the second end surface of the first semiconductor region 13. The i-p junction interface formed between the i-type fourth semiconductor region 65 and the p-type third semiconductor region 12 is exposed at the chip sidewall 19 of the silicon substrate 67. In addition, the i-n junction interface formed between the i-type fourth semiconductor region 65 and the n-type second semiconductor region 14 is exposed at the second main surface 11B side of the silicon substrate 67. However, at the chip sidewall 19, unlike in FIG. 2, the end portion 18 of the p-n junction interface is not exposed. As a result, even if some degree of changes in the surface state or surface damage to the chip outer-surface 19 of the semiconductor device 300 occurs, there is no influence on changes in the breakdown voltage of the semiconductor device 300. In particular, the breakdown of the p-n junction exposed at the edge portion (the chip outer surface) 19 of the earlier chip was dependent on passivation architecture at the chip outer surface (chip sidewall) 19 and "variations" in the breakdown voltage at the edge portion (chip sidewall) 19 of the earlier chip was large. However, with the semiconductor device 300 of the third embodiment, since the end portion 18 of the p-n junction interface is not exposed, even if there are some changes in the surface state or surface damage occurs at the edge portion (chip sidewall) 19 of the semiconductor device 300 (chip), it has no bearing on the change in the breakdown voltage of the semiconductor device 300.

In addition, since the impurity concentration of the n-type first semiconductor region 13 in contact with the p-type third semiconductor region 12 is set approximately five figures or more higher than that of the i-type fourth semiconductor region 65 surrounding the n-type first semiconductor region 13, when a reverse bias voltage is applied between the anode electrode layer 16 and the cathode electrode layer 17, the breakdown at the p-n junction between the p-type third semiconductor region 12 and the n-type first semiconductor region 13 occurs earlier than the breakdown at the i-n junction of the i-type fourth semiconductor region 65 and the n-type first semiconductor region 13 and the i-type fourth semiconductor region 65 and n-type second semiconductor region 14. Namely, with the third embodiment, even if the i-n junction interface between the n-type second semiconductor region 14 and the i-type fourth semiconductor region 65 is exposed at the second main surface 11B side of the silicon substrate 67, or the i-p junction interface between the p-type third semiconductor region 12 and the i-type fourth semiconductor region 65 is exposed at the chip sidewall 19, the breakdown of the p-n junction develops within the inner region, and it is configured such that high surface electric field is not applied to the i-n junction interface or the i-p junction interface at the exposed portion of the second main surface 11B or the chip sidewall 19. Namely, the electric field at the second main surface 11B is reduced, and the breakdown is made to occur in the junction interface within the semiconductor device 300 so that there can be stabilization in the prescription of the breakdown voltage.

As a result, with the semiconductor diode 300 of the third embodiment, it is possible to eliminate or reduce the need for coating processing using an insulating film or surface passivation processing such as wet cleansing using an acidic or alkaline chemical in order to protect the chip sidewall 19 from the external environment. In addition, with the chip sidewall 19, since the changes in the surface state or surface damage is allowable to a certain extent, handling of the chip is made easier. Accordingly, variations in the resultant product performances are reduced, improving process yields. Such an attempt to stabilize the breakdown voltage in this manner is similarly effective in, for example, a power semiconductor device with a higher breakdown voltage than the voltage regulator diode. Moreover, since the chip outer-surface is substantially orthogonal with the first end surface of the first semiconductor region 13, it is possible to form the sidewall of the semiconductor device 300 with a typical cutting process (dicing process). If the chip outer-surface 19 is substantially orthogonal with the top/bottom main surfaces 11B/11A, then the trouble involved in loading the chip into a jig, such as the collet, is reduced, and the handling of the semiconductor device 300 during fabrication (assembly) processes is improved.

If the impurity concentration $N_B$ of the first semiconductor region 13 is sufficiently higher than that of the fourth semiconductor region 65, then, as shown in Eq. (1), the breakdown voltage of the semiconductor diode 300 is dependent on only the impurity concentration $N_B$ of the first semiconductor region 13 and not dependent on the impurity concentration of the base material (silicon wafer) 67 used in manufacturing process. As a result, it is not necessary to precisely control the resistivity $\rho$ of the silicon wafer 67. Accordingly, if the substrate 67 has a relatively high resistivity compared to the impurity concentration $N_B$ of the first semiconductor region 13, any appropriate, commercially available silicon wafer 67 may be used to manufacture the voltage regulator diode 300 having the desired breakdown voltage.

Since the manufacturing method of the semiconductor diode 300 of the third embodiment is essentially the same as the manufacturing method of the semiconductor device 300 according to the second embodiment the overlapped description is omitted.

(Other Embodiments)

Various modifications will become possible for those skilled in the art after receiving the teaching of the present disclosure without departing from the scope thereof.

For example, while an exemplary voltage regulator diode 100 has been described in the description of the first embodiment, the present invention can, of course, be applied to a power semiconductor device having a higher breakdown voltage than the voltage regulator diode.

Moreover, while the use of an n-type silicon substrate 11 to form a semiconductor diode 100 has been described in the description of the first embodiment, it is, of course, also possible to use a p-type silicon substrate.

In addition, after the process of forming the second semiconductor region 14 shown in FIG. 3H and FIG. 3I, it is also possible to dope the second conductivity type impurity elements through the entire second main surface 11B of the semiconductor substrate 67 to form a slab-like third semiconductor region 12 and form a p-n junction with the second semiconductor region 14. More specifically, in the manufacturing method of the semiconductor device 100 of the first embodiment, the main surface at which the third semiconductor region 12 is formed may be reversed.

Moreover, either the process of forming the first semiconductor region 13, or the process of forming the second semiconductor region 14, may be performed first. In addition, the diffusion window used for selective diffusion may be opened in both the first main surface 11A and the second main surface 11B of the silicon substrate 67 to allow simultaneous diffusion through both main surfaces 11A, 11B. Moreover, blanket deposition or blanket ion implantation processes may be performed first in the time sequence for the first main surface 11A side or the second main surface 11B side of the semiconductor substrate 67; however, thereafter the driving-in (annealing processing) process may be performed simultaneously to form the first semiconductor region 13 and the second semiconductor region 14 at substantially the same time. In other words, the only question becomes which side of the semiconductor substrate 67 should be defined as "a first main surface 11A" and which should be defined as "second main surface 11B".

In addition, with the description of the first embodiment shown in FIG. 3A through FIG. 3L, the n-type first semiconductor region 13 and the n-type second semiconductor region 14 are doped using a selective diffusion method through main surfaces differing from one another; however, they may also be formed by doping through the same main surface like the double diffusion method.

Moreover, in the description of the first embodiment, the first main electrode layer 16 and the second main electrode layer 17 may be formed across the entire flat surface of both main surfaces of the silicon substrate 11. However, on at least one of the main surfaces of the silicon substrate 11, it may be possible to form a convex portion at the top surface of the second semiconductor region 14 or the third semiconductor region 12; and in this convex portion an electrode layer may be buried. In this manner, by burying the electrode layer in the convex portion, it is possible to increase the contact area of the electrode layer with the semiconductor region in which it is buried. Then, by adjusting the depth of the convex portion, it becomes possible to appropriately change the depth of the semiconductor region, allowing the smaller resistance value of the semiconductor region to be appropriately achieved.

Thus, the present invention of course includes various embodiments and modifications and the like which are not detailed above. Therefore, the scope of the present invention will be defined in the following claims.

What is claimed is:

1. A discrete semiconductor device merging only one vertical semiconductor element in a semiconductor chip, comprising a first semiconductor region of a first conductivity-type, defined by a first end surface, a second end surface opposing to the first end surface and a first outer surface connecting the first and second end surfaces;

a second semiconductor region of the first conductivity-type serving as a main electrode region of the vertical semiconductor element, being defined by a third end surface, a fourth end surface opposing to the third end surface and a second outer surface connecting the third and fourth end surfaces, the fourth end surface is in contact with the first end surface;

a third semiconductor region of a second conductivity-type serving as another main electrode region of the vertical semiconductor element, being contacted with the first semiconductor region at the second end surface, the second conductivity-type is opposite to the first conductivity type, outer surface of the third semiconductor region serving as a first part of a chip outer surface of the semiconductor chip; and a fourth semiconductor region having an inner surface in contact with the first and second outer surfaces and an impurity concentration lower than the first semiconductor region, configured such that the fourth semiconductor region surrounds the first and second semiconductor regions, the fourth semiconductor region is in contact with the third semiconductor region, the outer surface of the fourth semiconductor region serving as a second part of the chip outer surface of the semiconductor chip, and the second part being continuous to the first part of the chip outer surface.

2. The discrete semiconductor device of claim 1, wherein the chip outer surface is substantially orthogonal with the second end surface of the first semiconductor region.

3. The discrete semiconductor device of claim 1, wherein the fourth semiconductor region is made of a wafer cut from bulk crystal.

4. The discrete semiconductor device of claim 1, wherein a first main electrode layer is formed on a bottom surface of the third semiconductor region, and a second main electrode layer is formed on the third end surface of the second semiconductor region.

5. The discrete semiconductor device of claim 1, wherein the fourth semiconductor region has the first conductivity type.

6. The discrete semiconductor device of claim 1, wherein the fourth semiconductor region has the second conductivity type.

7. The discrete semiconductor device of claim 1, wherein the fourth semiconductor region is made of an intrinsic semiconductor region.

8. A method of manufacturing a plurality of discrete semiconductor devices, each device merging only one vertical semiconductor element in a semiconductor chip, comprising:

forming a first semiconductor region by selectively doping first conductivity-type impurity elements through a first main surface of a semiconductor substrate to a predetermined diffusion depth;

forming a second semiconductor region so as to contact with the first semiconductor region, by selectively doping the first conductivity-type impurity elements through a second main surface of the semiconductor substrate to a predetermined diffusion depth;

forming a third semiconductor region by doping second conductivity-type impurity elements through the entire first main surface of the semiconductor substrate so as to form a p-n junction between the first and third semiconductor regions; and cutting the semiconductor substrate substantially orthogonal with the p-n junction interface between the first and third semiconductor regions, dividing into a plurality of semiconductor chips, so as to provide a plurality of discrete semiconductor devices, each merging only one vertical semiconductor element in the semiconductor chip.

9. A method of manufacturing a plurality of discrete semiconductor devices, each device merging only one vertical semiconductor element in a semiconductor chip, comprising:

forming a first semiconductor region by selectively doping first conductivity-type impurity elements through a first main surface of a semiconductor substrate to a predetermined diffusion depth;

forming a second semiconductor region so as to contact with the first semiconductor region, by selectively doping the first conductivity-type impurity elements through a second main surface of the semiconductor substrate to a predetermined diffusion depth;

forming a third semiconductor region by doping second conductivity-type impurity elements through the entire second main surface of the semiconductor substrate so as to form a p-n junction between the second and third semiconductor regions;

cutting the semiconductor substrate substantially orthogonal with the p-n junction interface between the first and third semiconductor regions, dividing into a plurality of semiconductor chips, so as to provide a plurality of discrete semiconductor devices, each merging only one vertical semiconductor element in the semiconductor chip.

10. The method of claim 9, wherein the semiconductor substrate has the first conductivity type.

11. The method of claim 9, wherein the semiconductor substrate has the second conductivity type.

12. The method of claim 9, wherein the semiconductor substrate is made of an intrinsic semiconductor region.

* * * * *